United States Patent
Lee et al.

(10) Patent No.: US 12,021,116 B2
(45) Date of Patent: Jun. 25, 2024

(54) SEMICONDUCTOR GATES AND METHODS OF FORMING THE SAME

(71) Applicant: Taiwan Semiconductor Manufacturing Co., Ltd., Hsinchu (TW)

(72) Inventors: Hsin-Yi Lee, Hsinchu (TW); Cheng-Lung Hung, Hsinchu (TW); Chi On Chui, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 322 days.

(21) Appl. No.: 17/388,263

(22) Filed: Jul. 29, 2021

(65) Prior Publication Data

US 2022/0392998 A1    Dec. 8, 2022

Related U.S. Application Data

(60) Provisional application No. 63/196,980, filed on Jun. 4, 2021.

(51) Int. Cl.
| | |
|---|---|
| *H01L 29/06* | (2006.01) |
| *H01L 27/088* | (2006.01) |
| *H01L 29/08* | (2006.01) |
| *H01L 29/10* | (2006.01) |
| *H01L 29/66* | (2006.01) |
| *H01L 29/78* | (2006.01) |

(52) U.S. Cl.
CPC ...... *H01L 29/0673* (2013.01); *H01L 27/0886* (2013.01); *H01L 29/0847* (2013.01); *H01L 29/1033* (2013.01); *H01L 29/66553* (2013.01); *H01L 29/66795* (2013.01); *H01L 29/7851* (2013.01)

(58) Field of Classification Search
CPC ............ H01L 29/42392; H01L 29/785; H01L 29/0673; H01L 29/66553; H01L 29/66795; H01L 29/1033; H01L 29/0847; H01L 27/0886; H01L 29/7851; H01L 29/7848
See application file for complete search history.

(56) References Cited

U.S. PATENT DOCUMENTS

| | | |
|---|---|---|
| 9,209,247 B2 | 12/2015 | Colinge et al. |
| 9,236,267 B2 | 1/2016 | De et al. |

(Continued)

FOREIGN PATENT DOCUMENTS

| | | | |
|---|---|---|---|
| KR | 20190024625 A | 3/2019 | |
| KR | 20200051079 A | 5/2020 | |

(Continued)

*Primary Examiner* — Changhyun Yi

(74) *Attorney, Agent, or Firm* — Slater Matsil, LLP

(57) ABSTRACT

A semiconductor device includes nanosheets between the source/drain regions, and a gate structure over the substrate and between the source/drain regions, the gate structure including a gate dielectric material around each of the nanosheets, a work function material around the gate dielectric material, a first capping material around the work function material, a second capping material around the first capping material, wherein the second capping material is thicker at a first location between the nanosheets than at a second location along a sidewall of the nanosheets, and a gate fill material over the second capping material.

20 Claims, 30 Drawing Sheets

(56) References Cited

U.S. PATENT DOCUMENTS

| | | |
|---|---|---|
| 9,412,817 B2 | 8/2016 | Yang et al. |
| 9,412,828 B2 | 8/2016 | Ching et al. |
| 9,472,618 B2 | 10/2016 | Oxland |
| 9,502,265 B1 | 11/2016 | Jiang et al. |
| 9,520,482 B1 | 12/2016 | Chang et al. |
| 9,536,738 B2 | 1/2017 | Huang et al. |
| 9,576,814 B2 | 2/2017 | Wu et al. |
| 9,608,116 B2 | 3/2017 | Ching et al. |
| 2017/0207218 A1 | 7/2017 | Chang et al. |
| 2020/0152746 A1 | 5/2020 | Tsau et al. |
| 2020/0294865 A1 | 9/2020 | Cheng et al. |
| 2021/0118683 A1 | 4/2021 | Zhang et al. |
| 2021/0280468 A1 | 9/2021 | Chang et al. |
| 2021/0335676 A1 | 10/2021 | Cheng et al. |
| 2022/0059533 A1* | 2/2022 | Bae ................ H01L 21/823821 |
| 2022/0173096 A1 | 6/2022 | Huang et al. |
| 2022/0181259 A1 | 6/2022 | Chiang et al. |
| 2022/0231018 A1 | 7/2022 | Lee et al. |
| 2022/0352314 A1 | 11/2022 | Hsu et al. |

FOREIGN PATENT DOCUMENTS

| | | |
|---|---|---|
| KR | 20200064887 A | 6/2020 |
| TW | 202117859 A | 5/2021 |
| TW | 202117927 A | 5/2021 |
| TW | 202119620 A | 5/2021 |

* cited by examiner

SEMICONDUCTOR GATES AND METHODS OF FORMING THE SAME

PRIORITY CLAIM AND CROSS-REFERENCE

This patent application claims priority to U.S. Provisional Application No. 63/196,980, filed on Jun. 4, 2021 and entitled "Novel Sandwich WFM Structure of Nanosheet Device," which application is hereby incorporated by reference herein as if reproduced in its entirety.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
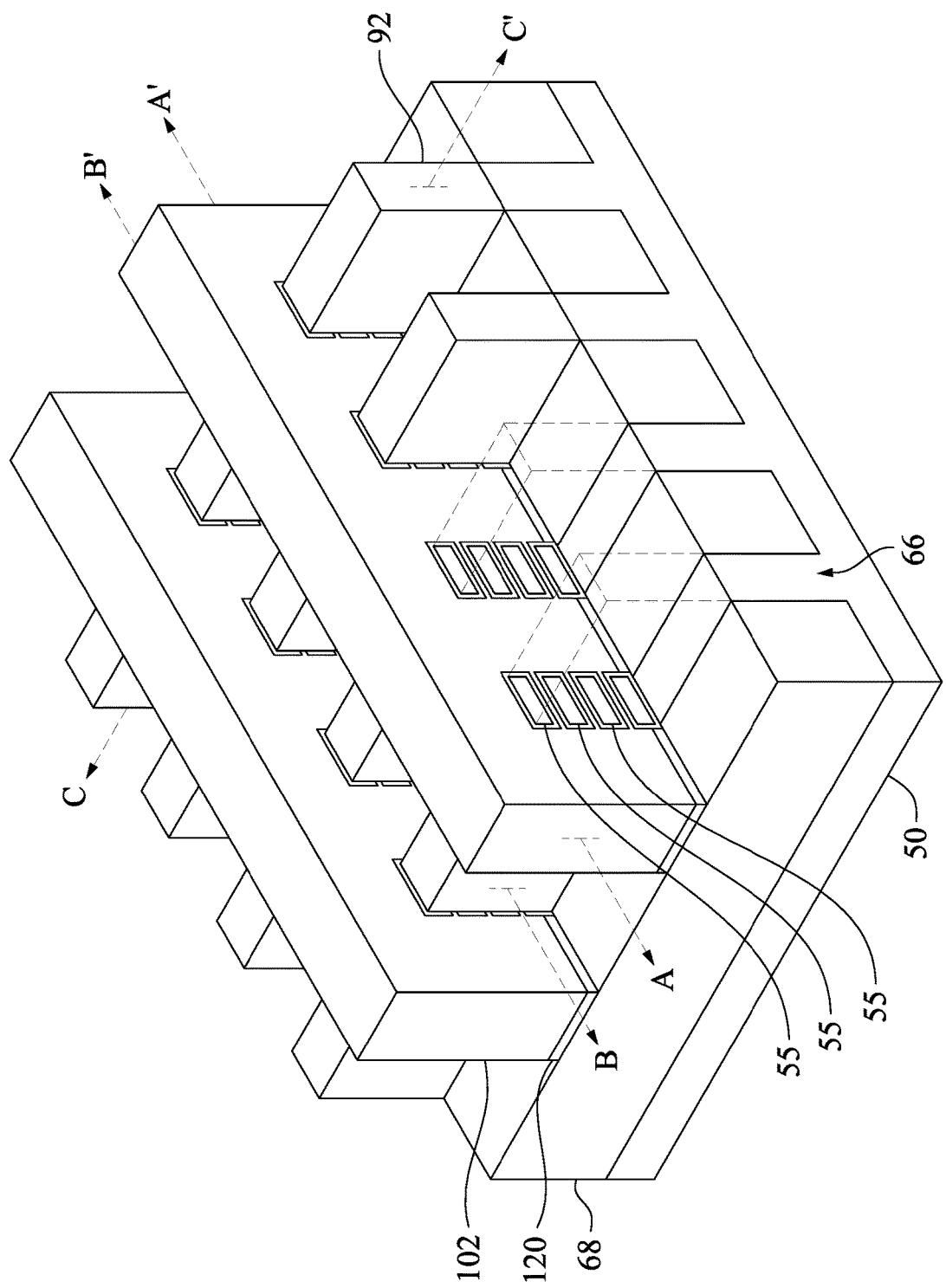
FIG. 1 illustrates an example of a nanostructure field-effect transistor (nano-FET) in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments provide semiconductor devices having improved performance and methods of forming the same. The semiconductor devices may be nanostructure field-effect transistors (nano-FETs, also referred to as nanosheet field-effect transistors (NSFETs), nanowire field-effect transistors (NWFETs), or gate-all-around field-effect transistors (GAAFETs)). These embodiments include methods applied to, but not limited to, the formation of a first capping material around the work function material of a first nanosheet of a nano-FET and the formation of the first capping material around the work function material of a second nanosheet of the nano-FET. Subsequently, a second capping material is formed around the first capping material of the first nanosheet of the nano-FET, and the second capping material is formed around the first capping material of the second nanosheet of the nano-FET. The first and the second nanosheets are adjacent to each other. The second capping material wraps around the first capping material and the work function material that surrounds the first nanosheet. The second capping material wraps around the first capping material and the work function material that surrounds the second nanosheet. The second capping material around the first nanosheet of the nano-FET merges with the second capping material around the second nanosheet of the nano-FET. Advantageous features of one or more embodiments disclosed herein may include preventing the first capping material around the work function material of the first nanosheet and the first capping material around the work function material of the second nanosheet from merging together and allowing for a more uniform thickness of the first capping material and the work function material at all locations. In addition, the disclosed method reduces threshold voltage $V_{TH}$ variation, thereby improving the performance of the device formed.

FIG. 1 illustrates an example of nano-FETs (e.g., nanowire FETs, nanosheet FETs, or the like) in a three-dimensional view, in accordance with some embodiments. The nano-FETs comprise nanostructures 55 (e.g., nanosheets, nanowire, or the like) over fins 66 on a substrate 50 (e.g., a semiconductor substrate), wherein the nanostructures 55 act as channel regions for the nano-FETs. The nanostructure 55 may include p-type nanostructures, n-type nanostructures, or a combination thereof. Shallow trench isolation (STI) regions 68 are disposed between adjacent fins 66, which may protrude above and from between neighboring STI regions 68. Although the STI regions 68 are described/illustrated as being separate from the substrate 50, as used herein, the term "substrate" may refer to the semiconductor substrate alone or a combination of the semiconductor substrate and the STI regions. Additionally, although bottom portions of the fins 66 are illustrated as being single, continuous materials with the substrate 50, the bottom portions of the fins 66 and/or the substrate 50 may comprise a single material or a plurality of materials. In this context, the fins 66 refer to the portion extending between the neighboring STI regions 68.

A gate layer stack 120 (which may include e.g., work function material, gate dielectric material, and capping materials) is over top surfaces of the fins 66 and along top surfaces, sidewalls, and bottom surfaces of the nanostructures 55. Gate electrodes 102 are over the gate layer stack 120. Epitaxial source/drain regions 92 are disposed on the fins 66 on opposing sides of the gate electrodes 102.

FIG. 1 further illustrates reference cross-sections that are used in later figures. Cross-section A-A' is along a longitudinal axis of a gate electrode 102 and in a direction, for example, perpendicular to the direction of current flow between the epitaxial source/drain regions 92 of a nano-FET. Cross-section B-B' is parallel to cross-section A-A' and extends through epitaxial source/drain regions 92 of multiple nano-FETs. Cross-section C-C' is perpendicular to cross-section A-A' and is parallel to a longitudinal axis of a fin 66 of the nano-FET and in a direction of, for example, a current flow between the epitaxial source/drain regions 92 of the nano-FET. Subsequent figures refer to these reference cross-sections for clarity.

Some embodiments discussed herein are discussed in the context of nano-FETs formed using a gate-last process. In other embodiments, a gate-first process may be used.

FIGS. 2 through 21B are cross-sectional views of intermediate stages in the manufacturing of nano-FETs, in accordance with some embodiments. FIGS. 2 through 5, 6A, 7A, 8A, 9A, 12A, 13A, 14A, 15A, 16A, 17A, 17B, 17C, 17D, 17F, 17G, 18A, 19A, 20A and 21A illustrate reference cross-section A-A' illustrated in FIG. 1. FIGS. 6B, 7B, 8B, 9B, 12B and 12C, illustrate reference cross-section B-B' illustrated in FIG. 1. FIGS. 6C, 7C, 8C, 9C, 10, 11, 12D, 13B, 14B, 15B, 16B, 17E, 18B, 19B, 20B and 21B illustrate reference cross-section C-C' illustrated in FIG. 1.

Figure 2:
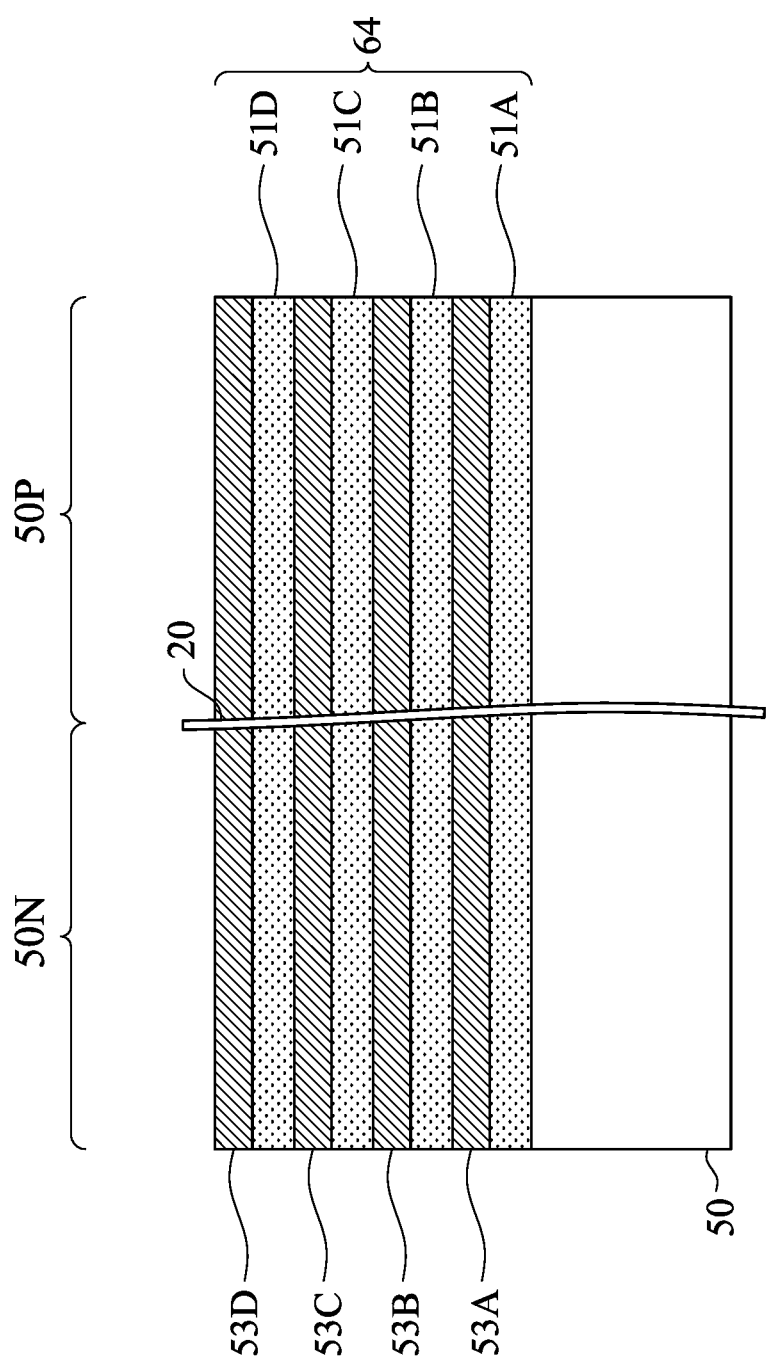
FIGS. 2, 3, 4, 5, 6A, 6B, 6C, 7A, 7B, 7C, 8A, 8B, 8C, 9A, 9B, 9C, 10, 11, 12A, 12B, 12C, 12D, 13A, 13B, 14A, 14B, 15A, 15B, 16A, 16B, 17A, 17B, 17C, 17D, 17E and 17F are cross-sectional views of intermediate stages in the manufacturing of nano-FETs, in accordance with some embodiments.

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

The substrate 50 has an n-type region 50N and a p-type region 50P. The n-type region 50N can be for forming n-type devices, such as NMOS transistors, e.g., n-type nano-FETs, and the p-type region 50P can be for forming p-type devices, such as PMOS transistors, e.g., p-type nano-FETs. The n-type region 50N may be physically separated from the p-type region 50P (as illustrated by divider 20), and any number of device features (e.g., other active devices, doped regions, isolation structures, etc.) may be disposed between the n-type region 50N and the p-type region 50P. Although one n-type region 50N and one p-type region 50P are illustrated, any number of n-type regions 50N and p-type regions 50P may be provided.

Further in FIG. 2, a multi-layer stack 64 is formed over the substrate 50. The multi-layer stack 64 includes alternating layers of first semiconductor layers 51A-51D (collectively referred to as first semiconductor layers 51) and second semiconductor layers 53A-53D (collectively referred to as second semiconductor layers 53). For purposes of illustration and as discussed in greater detail below, the first semiconductor layers 51A, 51B, 51C and 51D will be removed and the second semiconductor layers 53A, 53B, 53C and 53D will be patterned to form channel regions of nano-FETs in the n-type region 50N and the p-type region 50P. However, in some embodiments the first semiconductor layers 51A, 51B, 51C and 51D may be removed and the second semiconductor layers 53A, 53B, 53C and 53D may be patterned to form channel regions of nano-FETs in the n-type region 50N, and the second semiconductor layers 53A, 53B, 53C and 53D may be removed and the first semiconductor layers 51A, 51B, 51C and 51D may be patterned to form channel regions of nano-FETs in the p-type region 50P. In some embodiments the second semiconductor layers 53A, 53B, 53C and 53D may be removed and the first semiconductor layers 51A, 51B, 51C and 51D may be patterned to form channel regions of nano-FETs in the n-type region 50N, and the first semiconductor layers 51A, 51B, 51C and 51D may be removed and the second semiconductor layers 53A, 53B, and 53C may be patterned to form channel regions of nano-FETs in the p-type region 50P. In some embodiments, the second semiconductor layers 53A, 53B, 53C and 53D may be removed and the first semiconductor layers 51A, 51B, 51C and 51D may be patterned to form channel regions of nano-FETs in both the n-type region 50N and the p-type region 50P.

The multi-layer stack 64 is illustrated as including four layers of the first semiconductor layers 51 and four layers of the second semiconductor layers 53 for illustrative purposes. In some embodiments, the multi-layer stack 64 may include any number of the first semiconductor layers 51 and the second semiconductor layers 53. Each of the layers of the multi-layer stack 64 may be epitaxially grown using a process such as chemical vapor deposition (CVD), atomic layer deposition (ALD), vapor phase epitaxy (VPE), molecular beam epitaxy (MBE), or the like. In various embodiments, the first semiconductor layers 51 may be formed of a first semiconductor material suitable for p-type nano-FETs, such as silicon germanium or the like, and the second semiconductor layers 53 may be formed of a second semiconductor material suitable for n-type nano-FETs, such as silicon, silicon carbon, or the like. The multi-layer stack 64 is illustrated as having a bottommost semiconductor layer suitable for p-type nano-FETs for illustrative purposes. In some embodiments, multi-layer stack 64 may be formed such that the bottommost layer is a semiconductor layer suitable for n-type nano-FETs.

The first semiconductor materials and the second semiconductor materials may be materials having a high etch selectivity to one another. As such, the first semiconductor layers 51 of the first semiconductor material may be removed without significantly removing the second semiconductor layers 53 of the second semiconductor material thereby allowing the second semiconductor layers 53A, 53B, 53C and 53D to be patterned to form channel regions of nano-FETs. Similarly, in embodiments in which the second semiconductor layers 53 are removed and the first semiconductor layers 51A, 51B, 51C and 51D are patterned to form channel regions, the second semiconductor layers 53 of the second semiconductor material may be removed without significantly removing the first semiconductor layers 51 of the first semiconductor material, thereby allowing the first semiconductor layers 51A, 51B, 51C and 51D to be patterned to form channel regions of nano-FETs.

Figure 3:
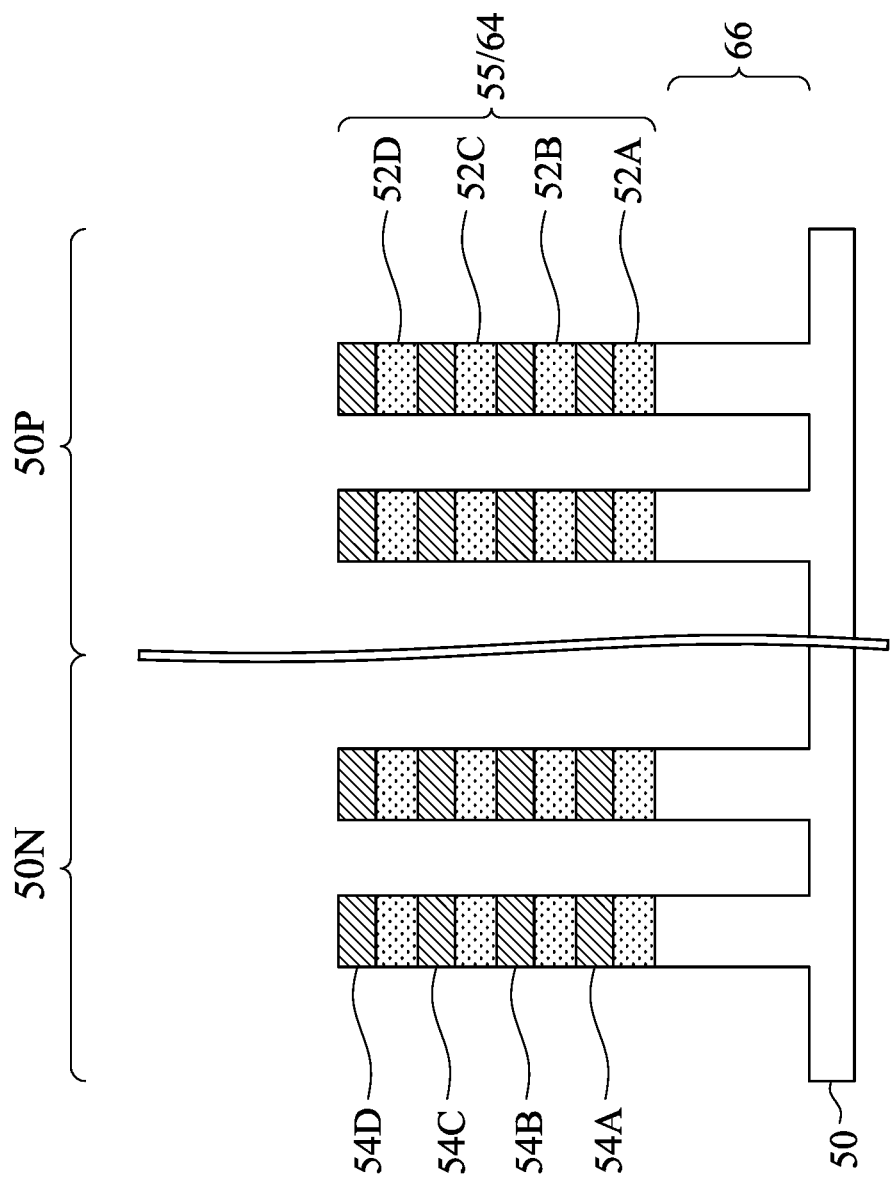

Referring now to FIG. 3, fins 66 are formed in the substrate 50 and nanostructures 55 are formed in the multi-layer stack 64, in accordance with some embodiments. In some embodiments, the nanostructures 55 and the fins 66 may be formed in the multi-layer stack 64 and the substrate 50, respectively, by etching trenches in the multi-layer stack 64 and the substrate 50. The etching may be any acceptable etch process, such as a reactive ion etch (RIE), neutral beam etch (NBE), the like, or a combination thereof. The etching may be anisotropic. Forming the nanostructures 55 by etching the multi-layer stack 64 may further define first nanostructures 52A-52D (collectively referred to as the first nanostructures 52) from the first semiconductor layers 51 and define second nanostructures 54A-54D (collectively referred to as the second nanostructures 54) from the second semiconductor layers 53. The first nanostructures 52 and the second nanostructures 54 may be collectively referred to as nanostructures 55.

The fins 66 and the nanostructures 55 may be patterned by any suitable method. For example, the fins 66 and the nanostructures 55 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins 66.

FIG. 3 illustrates the fins 66 in the n-type region 50N and the p-type region 50P as having substantially equal widths for illustrative purposes. In some embodiments, widths of the fins 66 in the n-type region 50N may be greater or thinner than the fins 66 in the p-type region 50P. Further, while each of the fins 66 and the nanostructures 55 are illustrated as having a consistent width throughout, in other embodiments, the fins 66 and/or the nanostructures 55 may have tapered sidewalls such that a width of each of the fins 66 and/or the nanostructures 55 continuously increases in a direction towards the substrate 50. In such embodiments, each of the nanostructures 55 may have a different width and be trapezoidal in shape.

Figure 4:
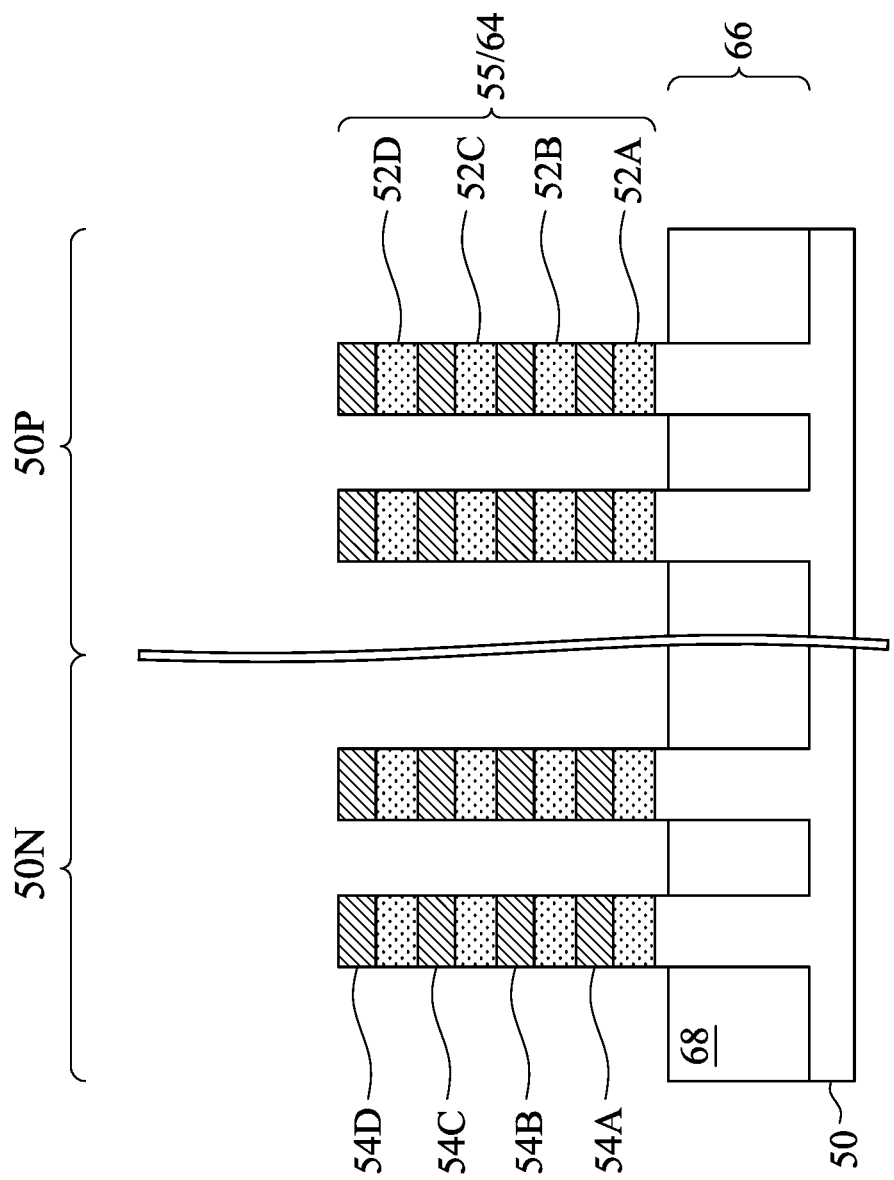

In FIG. 4, shallow trench isolation (STI) regions 68 are formed adjacent the fins 66. The STI regions 68 may be formed by depositing an insulation material over the substrate 50, the fins 66, and nanostructures 55, and between adjacent fins 66. The insulation material may be an oxide, such as silicon oxide, a nitride, the like, or a combination thereof, and may be formed by high-density plasma CVD (HDP-CVD), flowable CVD (FCVD), the like, or a combination thereof. Other insulation materials formed by any acceptable process may be used. In the illustrated embodiment, the insulation material is silicon oxide formed by an FCVD process. An anneal process may be performed once the insulation material is formed. In an embodiment, the insulation material is formed such that excess insulation material covers the nanostructures 55. Although the insulation material is illustrated as a single layer, some embodiments may utilize multiple layers. For example, in some embodiments a liner (not separately illustrated) may first be formed along a surface of the substrate 50, the fins 66, and the nanostructures 55. Thereafter, a fill material, such as those discussed above may be formed over the liner.

A removal process is then applied to the insulation material to remove excess insulation material over the nanostructures 55. In some embodiments, a planarization process such as a chemical mechanical polish (CMP), an etch-back process, combinations thereof, or the like may be utilized. The planarization process exposes the nanostructures 55 such that top surfaces of the nanostructures 55 and the insulation material are level after the planarization process is complete.

The insulation material is then recessed to form the STI regions 68. The insulation material is recessed such that upper portions of fins 66 in the n-type region 50N and the p-type region 50P protrude from between neighboring STI regions 68. Further, the top surfaces of the STI regions 68 may have a flat surface as illustrated, a convex surface, a concave surface (such as dishing), or a combination thereof. The top surfaces of the STI regions 68 may be formed flat, convex, and/or concave by an appropriate etch. The STI regions 68 may be recessed using an acceptable etching process, such as one that is selective to the material of the insulation material (e.g., etches the material of the insulation material at a faster rate than the material of the fins 66 and the nanostructures 55). For example, an oxide removal using, for example, dilute hydrofluoric (dHF) acid may be used.

The process described above with respect to FIGS. 2 through 4 is just one example of how the fins 66 and the nanostructures 55 may be formed. In some embodiments, the fins 66 and/or the nanostructures 55 may be formed using a mask and an epitaxial growth process. For example, a dielectric layer can be formed over a top surface of the substrate 50, and trenches can be etched through the dielectric layer to expose the underlying substrate 50. Epitaxial structures can be epitaxially grown in the trenches, and the dielectric layer can be recessed such that the epitaxial structures protrude from the dielectric layer to form the fins 66 and/or the nanostructures 55. The epitaxial structures may comprise the alternating semiconductor materials discussed above, such as the first semiconductor materials and the second semiconductor materials. In some embodiments where epitaxial structures are epitaxially grown, the epitaxially grown materials may be in situ doped during growth, which may obviate prior and/or subsequent implantations, although in situ and implantation doping may be used together.

Additionally, the first semiconductor layers 51 (and resulting first nanostructures 52) and the second semiconductor layers 53 (and resulting second nanostructures 54) are illustrated and discussed herein as comprising the same materials in the p-type region 50P and the n-type region 50N for illustrative purposes only. As such, in some embodiments one or both of the first semiconductor layers 51 and the second semiconductor layers 53 may be different materials or formed in a different order in the p-type region 50P and the n-type region 50N.

Further in FIG. 4, appropriate wells (not separately illustrated) may be formed in the fins 66, the nanostructures 55, and/or the STI regions 68. In embodiments with different well types, different implant steps for the n-type region 50N and the p-type region 50P may be achieved using a photoresist or other masks (not separately illustrated). For example, a photoresist may be formed over the fins 66 and the STI regions 68 in the n-type region 50N and the p-type region 50P. The photoresist is patterned to expose the p-type region 50P. The photoresist can be formed by using a spin-on technique and can be patterned using acceptable photolithography techniques. Once the photoresist is patterned, an n-type impurity implant is performed in the p-type region 50P, and the photoresist may act as a mask to substantially prevent n-type impurities from being implanted into the n-type region 50N. The n-type impurities may be phosphorus, arsenic, antimony, or the like implanted in the region to a concentration in a range from about $10^{13}$ atoms/cm$^3$ to about $10^{14}$ atoms/cm$^3$. After the implant, the photoresist is removed, such as by an acceptable ashing process.

Following or prior to the implanting of the p-type region 50P, a photoresist or other masks (not separately illustrated) is formed over the fins 66, the nanostructures 55, and the STI regions 68 in the p-type region 50P and the n-type region 50N. The photoresist is patterned to expose the n-type region 50N. The photoresist can be formed by using a spin-on technique and can be patterned using acceptable photolithography techniques. Once the photoresist is patterned, a p-type impurity implant may be performed in the n-type region 50N, and the photoresist may act as a mask to substantially prevent p-type impurities from being implanted into the p-type region 50P. The p-type impurities may be boron, boron fluoride, indium, or the like implanted in the region to a concentration in a range from about $10^{13}$ atoms/cm$^3$ to about $10^{14}$ atoms/cm$^3$. After the implant, the photoresist may be removed, such as by an acceptable ashing process.

After the implants of the n-type region 50N and the p-type region 50P, an anneal may be performed to repair implant damage and to activate the p-type and/or n-type impurities that were implanted. In some embodiments, the grown materials of epitaxial fins may be in situ doped during growth, which may obviate the implantations, although in situ and implantation doping may be used together.

Figure 5:
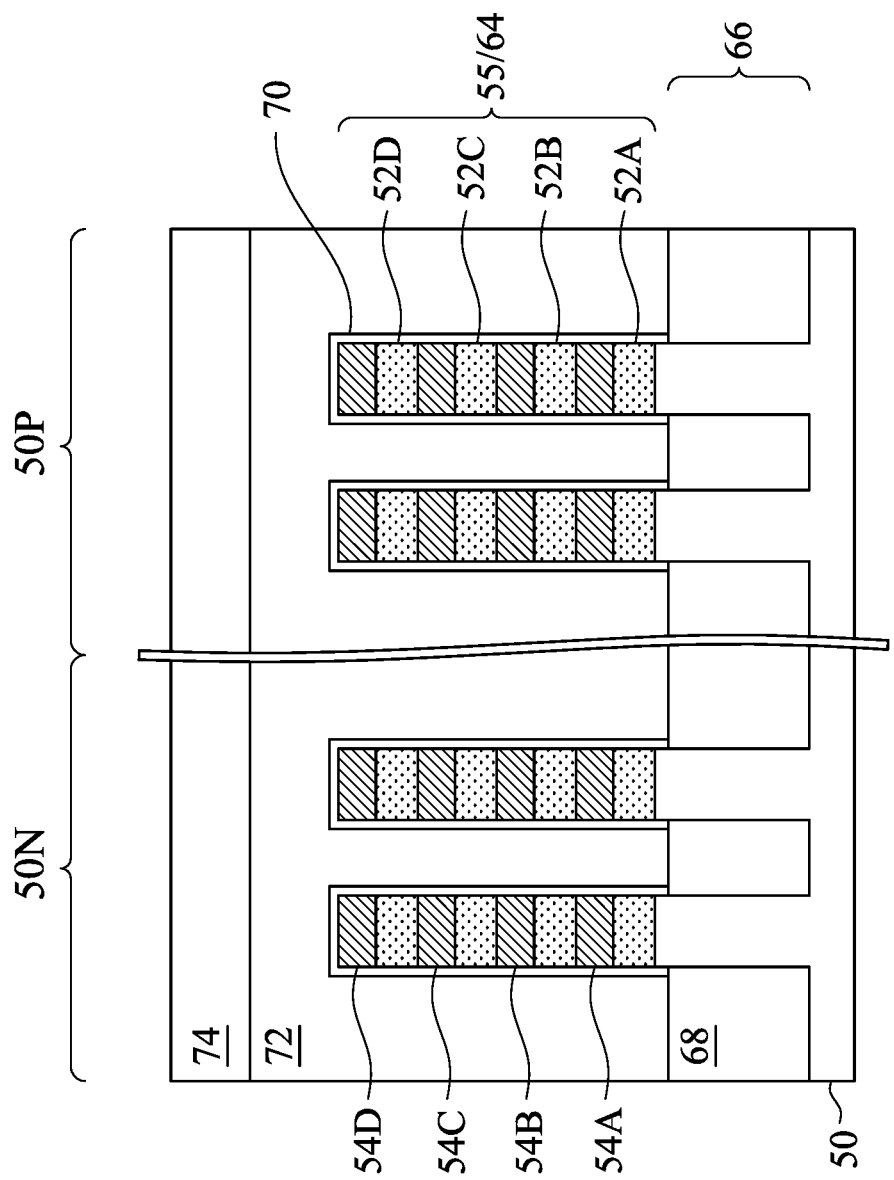

In FIG. 5, a dummy dielectric layer 70 is formed on the fins 66 and/or the nanostructures 55. The dummy dielectric layer 70 may be, for example, silicon oxide, silicon nitride, a combination thereof, or the like, and may be deposited or thermally grown according to acceptable techniques. A dummy gate layer 72 is formed over the dummy dielectric layer 70, and a mask layer 74 is formed over the dummy gate layer 72. The dummy gate layer 72 may be deposited over the dummy dielectric layer 70 and then planarized, such as by a CMP. The mask layer 74 may be deposited over the dummy gate layer 72. The dummy gate layer 72 may be a conductive or non-conductive material and may be selected from a group including amorphous silicon, polycrystalline-silicon (polysilicon), poly-crystalline silicon-germanium (poly-SiGe), metallic nitrides, metallic silicides, metallic oxides, and metals. The dummy gate layer 72 may be deposited by physical vapor deposition (PVD), CVD, sputter deposition, or other techniques for depositing the selected material. The dummy gate layer 72 may be made of other materials that have a high etching selectivity from the etching of isolation regions. The mask layer 74 may include, for example, silicon nitride, silicon oxynitride, or the like. In this example, a single dummy gate layer 72 and a single mask layer 74 are formed across the n-type region 50N and the p-type region 50P. It is noted that the dummy dielectric layer 70 is shown covering only the fins 66 and the nanostructures 55 for illustrative purposes only. In some embodiments, the dummy dielectric layer 70 may be deposited such that the dummy dielectric layer 70 covers the STI regions 68, such that the dummy dielectric layer 70 extends between the dummy gate layer 72 and the STI regions 68.

Figure 6A:
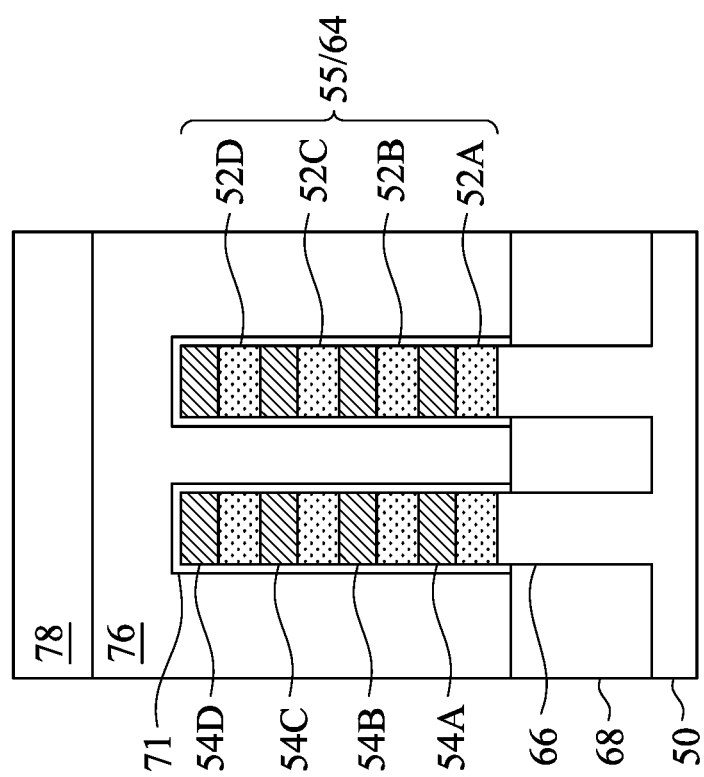
Figure 6B:
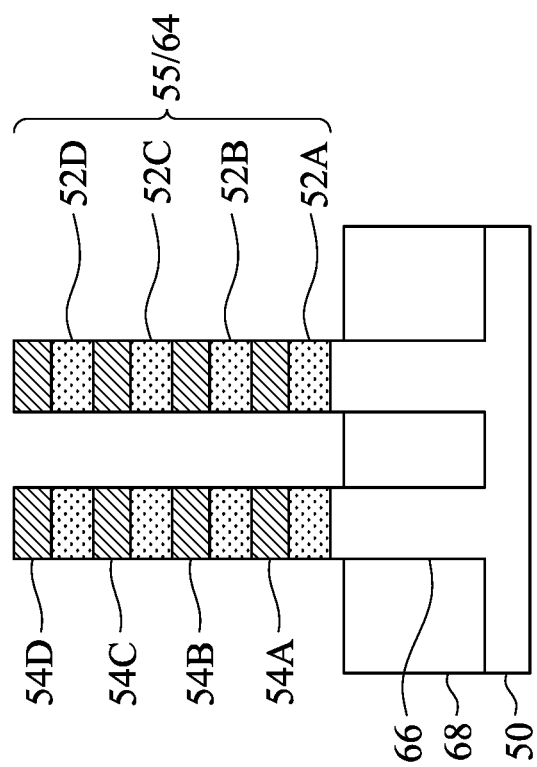
Figure 6C:
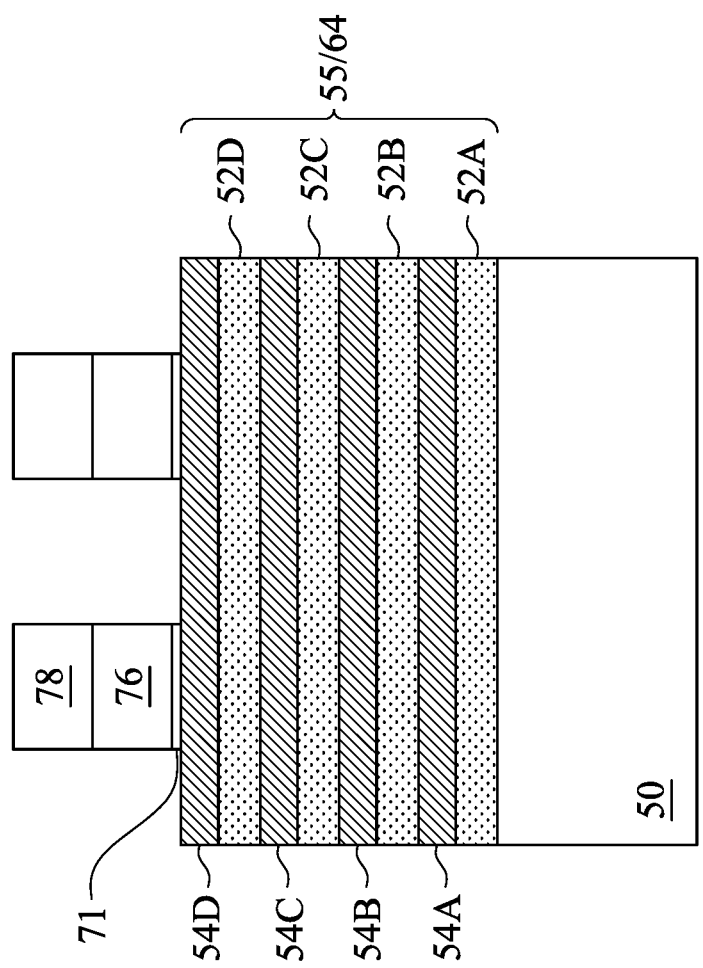

FIGS. 6A through 21B illustrate various additional steps in the manufacturing of embodiment devices. FIGS. 6A through 21B illustrate features in either the n-type region 50N or the p-type region 50P. In FIGS. 6A through 6C, the mask layer 74 (see FIG. 5) may be patterned using acceptable photolithography and etching techniques to form masks 78. The pattern of the masks 78 then may be transferred to the dummy gate layer 72 and to the dummy dielectric layer 70 to form dummy gates 76 and dummy gate dielectrics 71, respectively. The dummy gates 76 cover respective channel regions of the fins 66. The pattern of the masks 78 may be used to physically separate each of the dummy gates 76 from adjacent dummy gates 76. The dummy gates 76 may also have a lengthwise direction substantially perpendicular to the lengthwise direction of respective fins 66.

Figure 7B:
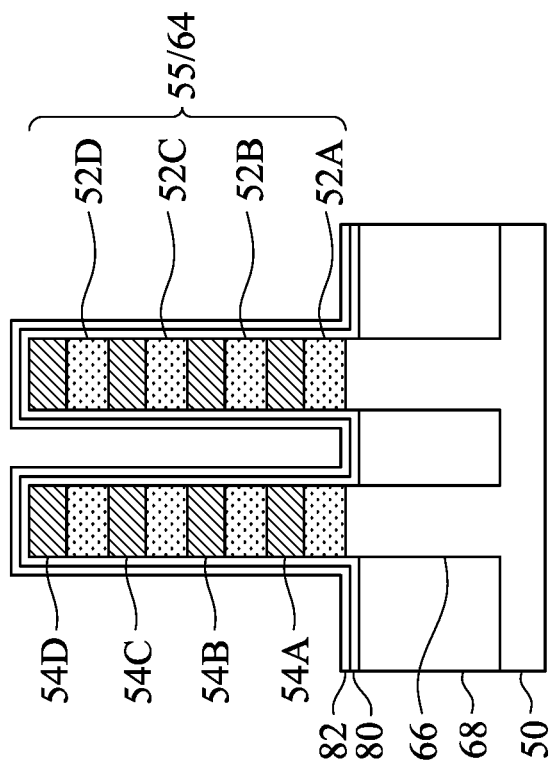
Figure 7A:
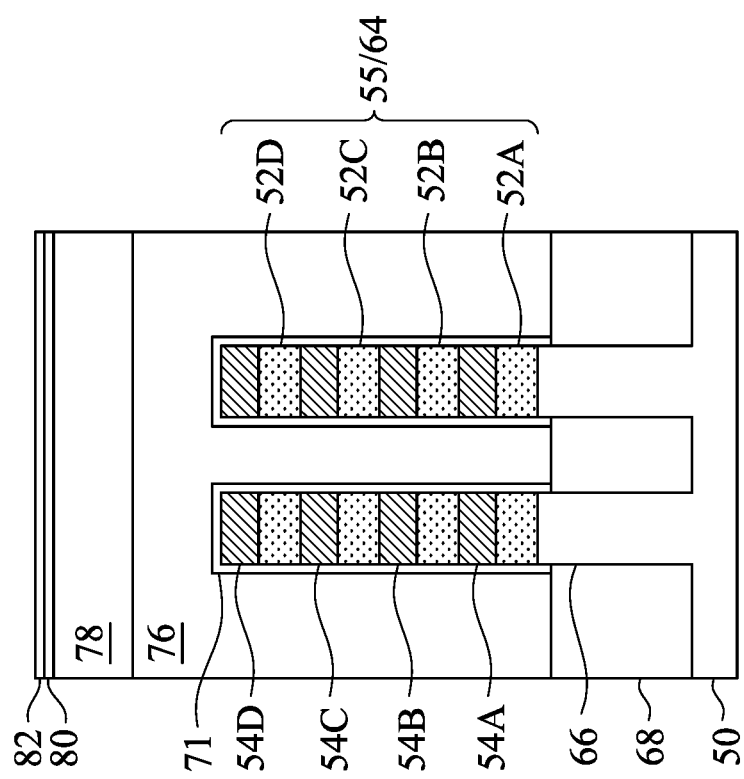
Figure 7C:
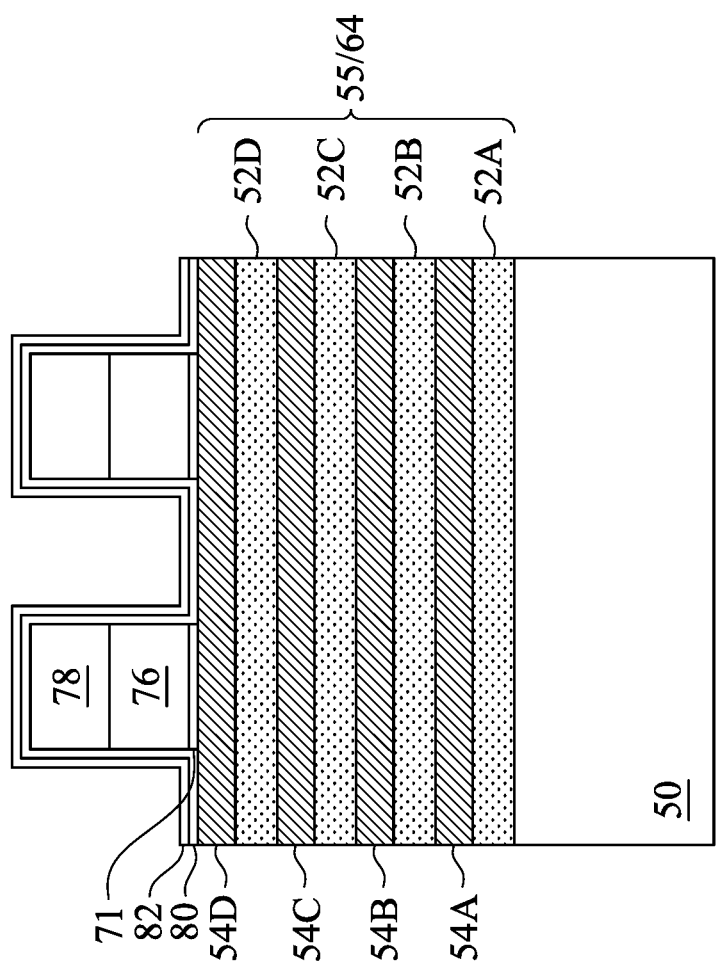

In FIGS. 7A through 7C, a first spacer layer 80 and a second spacer layer 82 are formed over the structures illustrated in FIGS. 6A through 6C. The first spacer layer 80 and the second spacer layer 82 will be subsequently patterned to act as spacers for forming self-aligned source/drain regions. In FIGS. 7A through 7C, the first spacer layer 80 is formed on top surfaces of the STI regions 68; top surfaces and sidewalls of the fins 66, the nanostructures 55, and the masks 78; and sidewalls of the dummy gates 76 and the dummy gate dielectric 71. The second spacer layer 82 is deposited over the first spacer layer 80. The first spacer layer 80 may be formed of silicon oxide, silicon nitride, silicon oxynitride, or the like, using techniques such as thermal oxidation or deposited by CVD, ALD, or the like. The second spacer layer 82 may be formed of a material having a different etch rate than the material of the first spacer layer 80, such as silicon oxide, silicon nitride, silicon oxynitride, or the like, and may be deposited by CVD, ALD, or the like.

After the first spacer layer 80 is formed and prior to forming the second spacer layer 82, implants for lightly doped source/drain (LDD) regions (not separately illustrated) may be performed. In embodiments with different device types, similar to the implants discussed above in FIG. 4, a mask, such as a photoresist, may be formed over the n-type region 50N, while exposing the p-type region 50P, and appropriate type (e.g., p-type) impurities may be implanted into the exposed fins 66 and nanostructures 55 in the p-type region 50P. The mask may then be removed. Subsequently, a mask, such as a photoresist, may be formed over the p-type region 50P while exposing the n-type region 50N, and appropriate type impurities (e.g., n-type) may be implanted into the exposed fins 66 and nanostructures 55 in the n-type region 50N. The mask may then be removed. The n-type impurities may be the any of the n-type impurities previously discussed, and the p-type impurities may be the any of the p-type impurities previously discussed. The lightly doped source/drain regions may have a concentration of impurities in a range from about $1 \times 10^{15}$ atoms/cm$^3$ to about $1 \times 10^{19}$ atoms/cm$^3$. An anneal may be used to repair implant damage and to activate the implanted impurities.

Figure 8B:
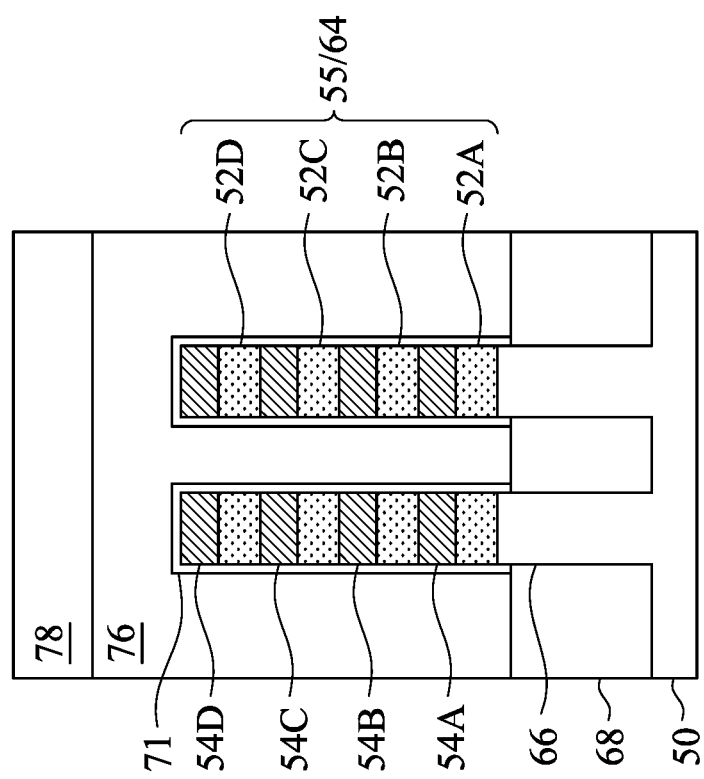
Figure 8A:
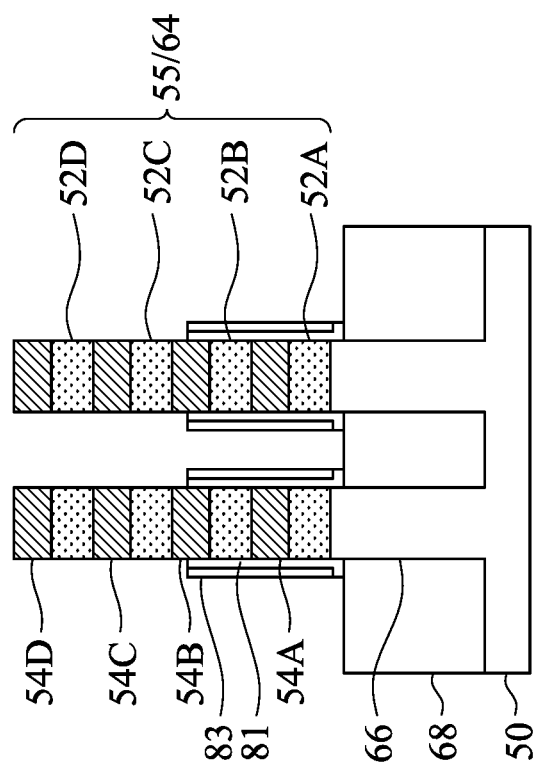
Figure 8C:
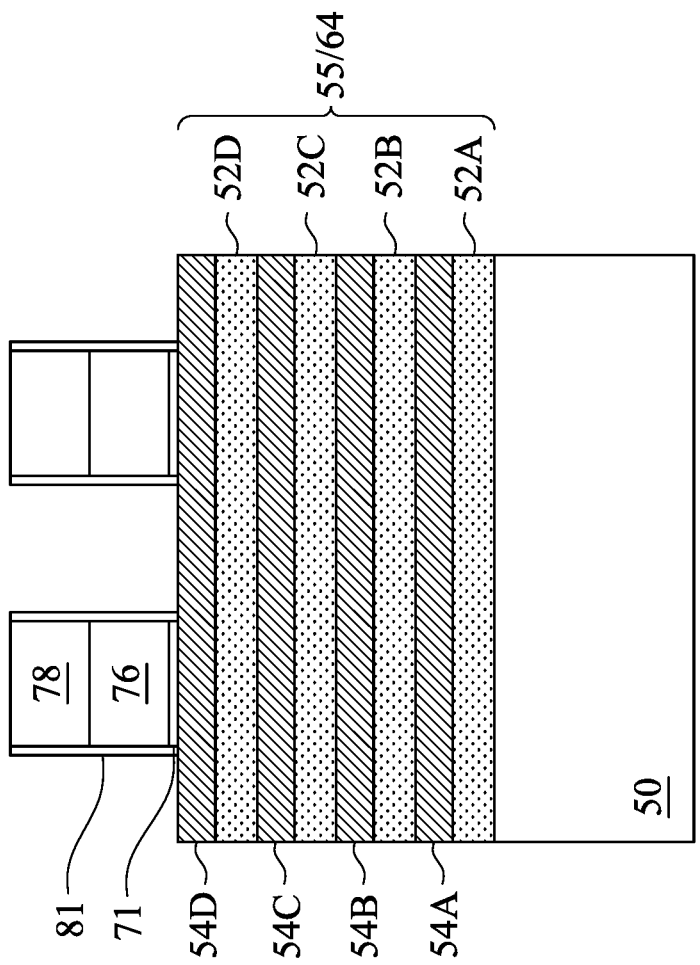

In FIGS. 8A through 8C, the first spacer layer 80 and the second spacer layer 82 are etched to form first spacers 81 and second spacers 83. As will be discussed in greater detail below, the first spacers 81 and the second spacers 83 act to self-aligned subsequently formed source drain regions, as well as to protect sidewalls of the fins 66 and/or nanostructure 55 during subsequent processing. The first spacer layer 80 and the second spacer layer 82 may be etched using a suitable etching process, such as an isotropic etching process (e.g., a wet etching process), an anisotropic etching process (e.g., a dry etching process), or the like. In some embodiments, the material of the second spacer layer 82 has a different etch rate than the material of the first spacer layer 80, such that the first spacer layer 80 may act as an etch stop layer when patterning the second spacer layer 82 and such that the second spacer layer 82 may act as a mask when patterning the first spacer layer 80. For example, the second spacer layer 82 may be etched using an anisotropic etch process wherein the first spacer layer 80 acts as an etch stop layer, wherein remaining portions of the second spacer layer 82 form second spacers 83 as illustrated in FIG. 8B. Thereafter, the second spacers 83 acts as a mask while etching exposed portions of the first spacer layer 80, thereby forming first spacers 81 as illustrated in FIGS. 8B and 8C.

As illustrated in FIG. 8B, the first spacers 81 and the second spacers 83 are disposed on sidewalls of the fins 66 and/or nanostructures 55. As illustrated in FIG. 8C, in some embodiments, the second spacer layer 82 may be removed from over the first spacer layer 80 adjacent the masks 78, the dummy gates 76, and the dummy gate dielectrics 71, and the first spacers 81 are disposed on sidewalls of the masks 78, the dummy gates 76, and the dummy gate dielectrics 71. In other embodiments, a portion of the second spacer layer 82 may remain over the first spacer layer 80 adjacent the masks 78, the dummy gates 76, and the dummy gate dielectrics 71.

It is noted that the above disclosure generally describes a process of forming spacers and LDD regions. Other processes and sequences may be used. For example, fewer or additional spacers may be utilized, different sequence of steps may be utilized (e.g., the first spacers 81 may be patterned prior to depositing the second spacer layer 82), additional spacers may be formed and removed, and/or the like. Furthermore, the n-type and p-type devices may be formed using different structures and steps.

Figure 9B:
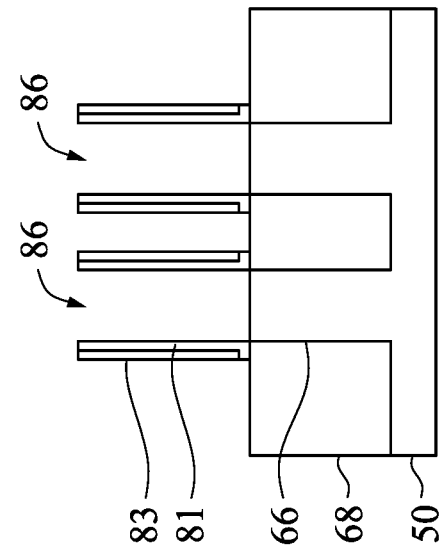
Figure 9A:
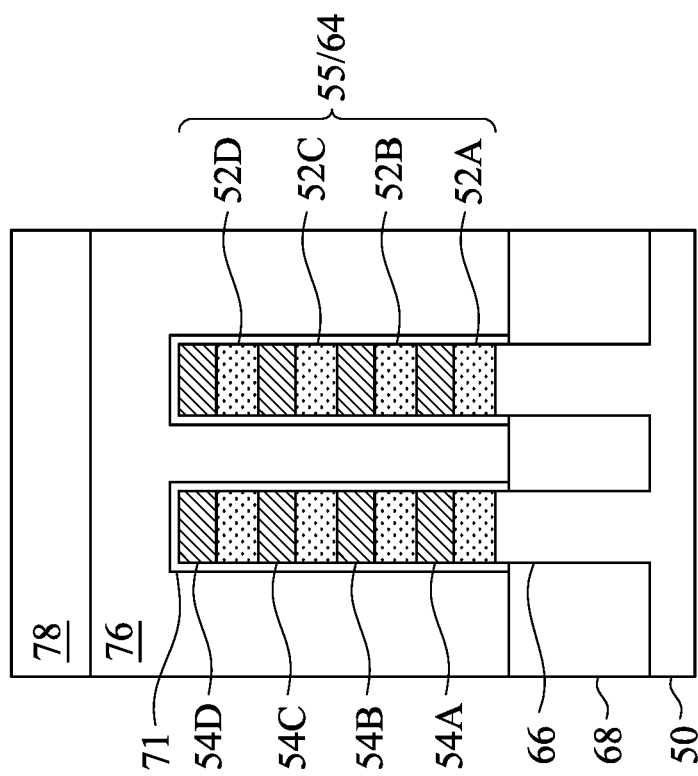
Figure 9C:
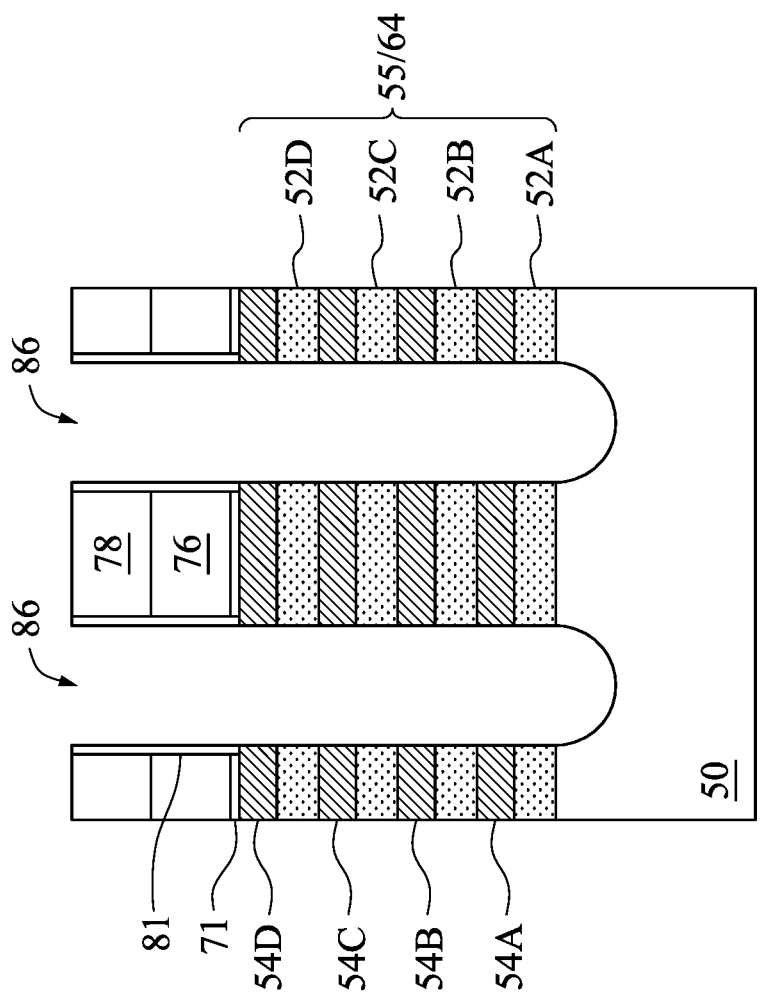

In FIGS. 9A through 9C, first recesses 86 are formed in the nanostructures 55, in accordance with some embodiments. Epitaxial materials and epitaxial source/drain regions will be subsequently formed in the first recesses 86. The first recesses 86 may extend through the first nanostructures 52 and the second nanostructures 54. As illustrated in FIG. 9B, top surfaces of the STI regions 68 may be level with bottom surfaces of the first recesses 86. In various embodiments, the nanostructures 55 may be etched such that bottom surfaces of the first recesses 86 are disposed below the top surfaces of the STI regions 68 or the like. In some embodiments, the first recesses 86 may also extend partially through the substrate 50.

The first recesses 86 may be formed by etching the nanostructures 55 using anisotropic etching processes, such as RIE, NBE, or the like. The first spacers 81, the second spacers 83, and the masks 78 mask portions of the fins 66, the nanostructures 55, and the substrate 50 during the etching processes used to form the first recesses 86. A single etch process or multiple etch processes may be used to etch each layer of the nanostructures 55. Timed etch processes may be used to stop the etching after the first recesses 86 reach desired depths.

Figure 10:
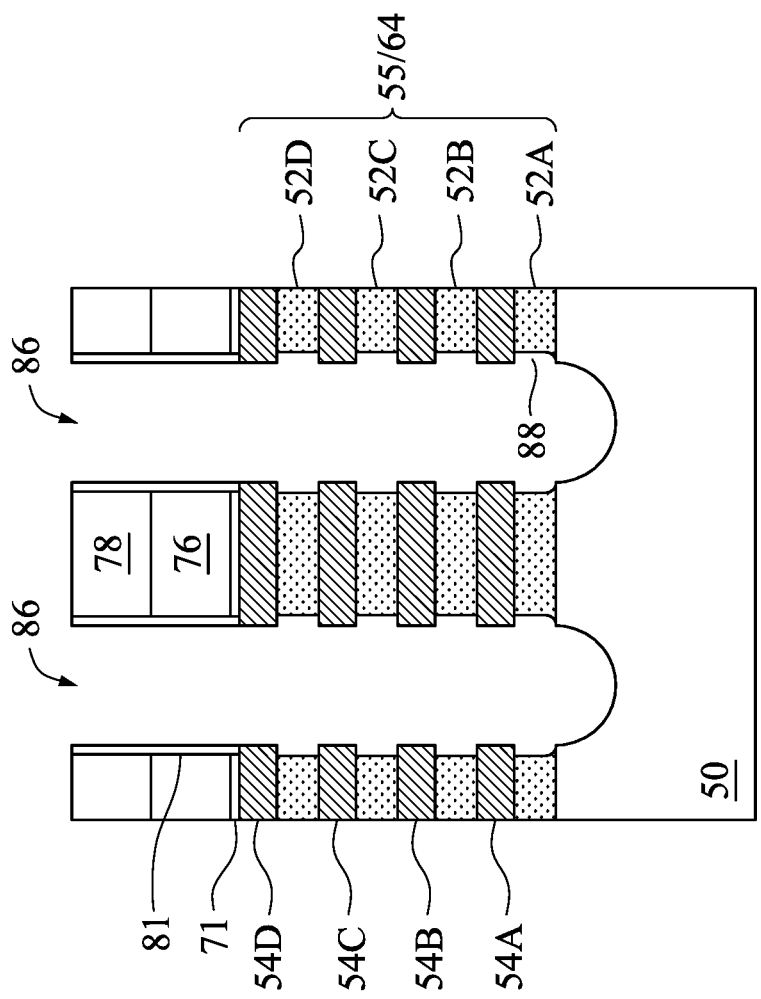

In FIG. 10, portions of sidewalls of the layers of the multi-layer stack 64 formed of the first semiconductor materials (e.g., the first nanostructures 52) exposed by the first recesses 86 are etched to form sidewall recesses 88. Although sidewalls of the first nanostructures 52 adjacent the sidewall recesses 88 are illustrated as being straight in FIG. 10, the sidewalls may be concave or convex. The sidewalls may be etched using isotropic etching processes, such as wet etching or the like. In an embodiment in which the first nanostructures 52 include, e.g., SiGe, and the second nanostructures 54 include, e.g., Si or SiC, a dry etch process with tetramethylammonium hydroxide (TMAH), ammonium hydroxide ($NH_4OH$), or the like may be used to etch sidewalls of the first nanostructures 52.

Figure 11:
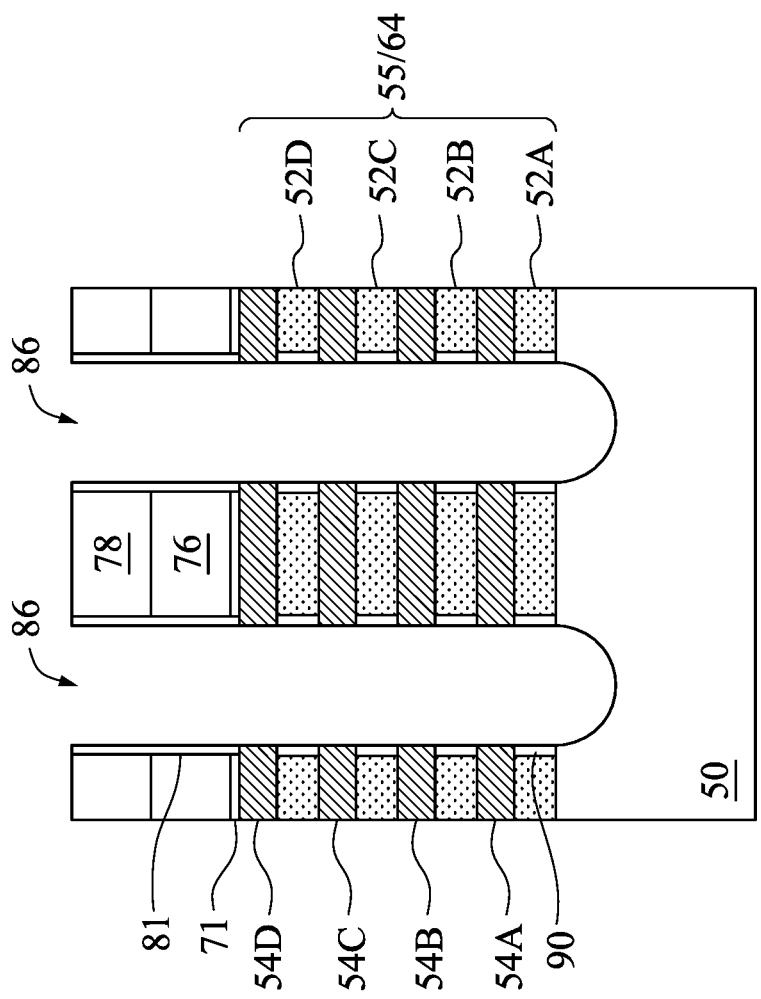

In FIG. 11, first inner spacers 90 are formed in the sidewall recess 88. The first inner spacers 90 may be formed by depositing an inner spacer layer (not separately illustrated) over the structures illustrated in FIG. 10. The first inner spacers 90 act as isolation features between subsequently formed source/drain regions and the gate layer stack 120 (shown subsequently in FIG. 17E). As will be discussed in greater detail below, epitaxial source/drain regions and epitaxial materials will be formed in the first recesses 86, while the first nanostructures 52A, 52B, 52C and 52D will be replaced with the gate layer stack 120.

The inner spacer layer may be deposited by a conformal deposition process, such as CVD, ALD, or the like. The inner spacer layer may comprise a material such as silicon carbonitride (SiCN) or silicon oxycarbonitride (SiOCN). In other embodiments, silicon nitride or silicon oxynitride, or any suitable material, such as low-dielectric constant (low-k) materials having a k-value less than about 3.5, may be utilized. The inner spacer layer may then be anisotropically etched to form the first inner spacers 90. Although outer sidewalls of the first inner spacers 90 are illustrated as being flush with sidewalls of the second nanostructures 54, the outer sidewalls of the first inner spacers 90 may extend beyond or be recessed from sidewalls of the second nanostructures 54. Moreover, although the outer sidewalls of the first inner spacers 90 are illustrated as being straight in FIG. 11, the outer sidewalls of the first inner spacers 90 may be concave or convex. The inner spacer layer may be etched by an anisotropic etching process, such as RIE, NBE, or the like. The first inner spacers 90 may be used to prevent damage to subsequently formed source/drain regions (shown in FIGS. 12A through 12D) by subsequent etching processes, such as etching processes used to form the gate layer stack 120 (shown in FIG. 17E).

In FIGS. 12A-12D epitaxial source/drain regions 92 are formed in the recesses 86 in the regions 50N and region 50P. The epitaxial source/drain regions 92 are formed in the recesses 86, such that each dummy gate 76 is disposed between respective neighboring pairs of the epitaxial source/drain regions 92. In some embodiments, the first spacers 81 are used to separate the epitaxial source/drain regions 92 from the dummy gates 76 by an appropriate lateral distance so that the epitaxial source/drain regions 92 do not short out subsequently formed gates of the resulting nano-FETs. The first inner spacers 90 may also be used to separate the epitaxial source/drain regions 92 from the dummy gates 76 and to prevent shorts between the epitaxial source/drain regions 92 and the subsequently formed gate layer stack 120.

The epitaxial source/drain regions 92 may be formed by epitaxially growing any acceptable material, in the recesses 86. The epitaxial source/drain regions 92 in the NMOS regions may include any acceptable material, such as appropriate for n-type nano-FETs. For example, the epitaxial source/drain regions 92 may include materials exerting a tensile strain in the channel layers, such as silicon, silicon carbide, phosphorous doped silicon carbide, silicon phosphide, or the like. The epitaxial source/drain regions 92 in the PMOS regions may include any acceptable material, such as appropriate for p-type nano-FETs. For example, the epitaxial source/drain regions 92 may include materials exerting a compressive strain in the channel layers, such as silicon-germanium, boron doped silicon-germanium, germanium, germanium tin, or the like. The epitaxial source/drain regions 92 may have surfaces raised from respective surfaces of the multi-layer stack 64 and may have facets. In some embodiments, a material of the epitaxial source/drain regions 92 may also be selected to exert a desired stress on the channel layers of the multi-layer stack 64, thereby improving performance. For example, it has been observed that for n-type nano-FETs, a material that exerts tensile stress may be beneficial while for p-type nano-FETS, a material that exerts compressive stress may be beneficial.

Figure 12B:
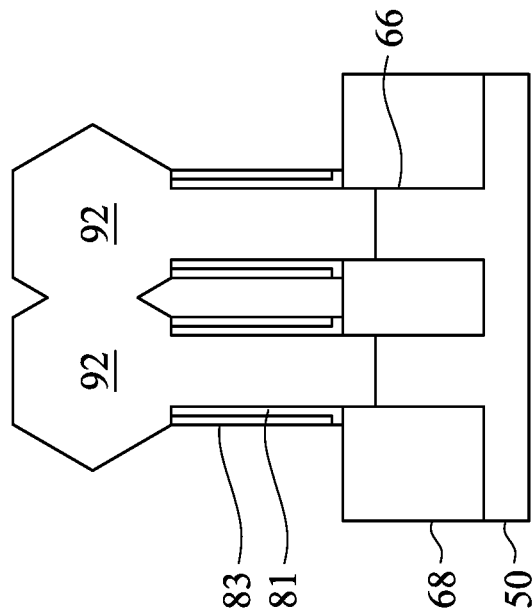
Figure 12A:
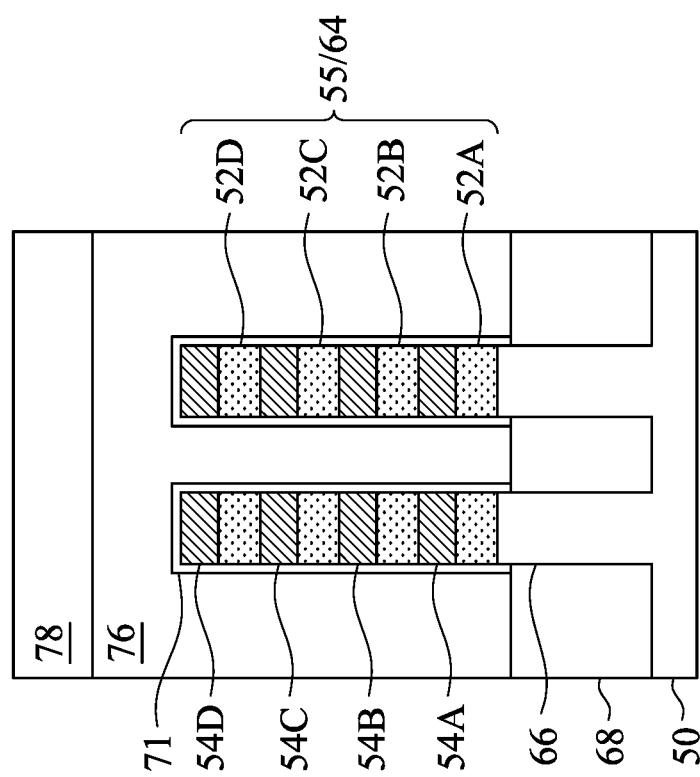
Figure 12D:
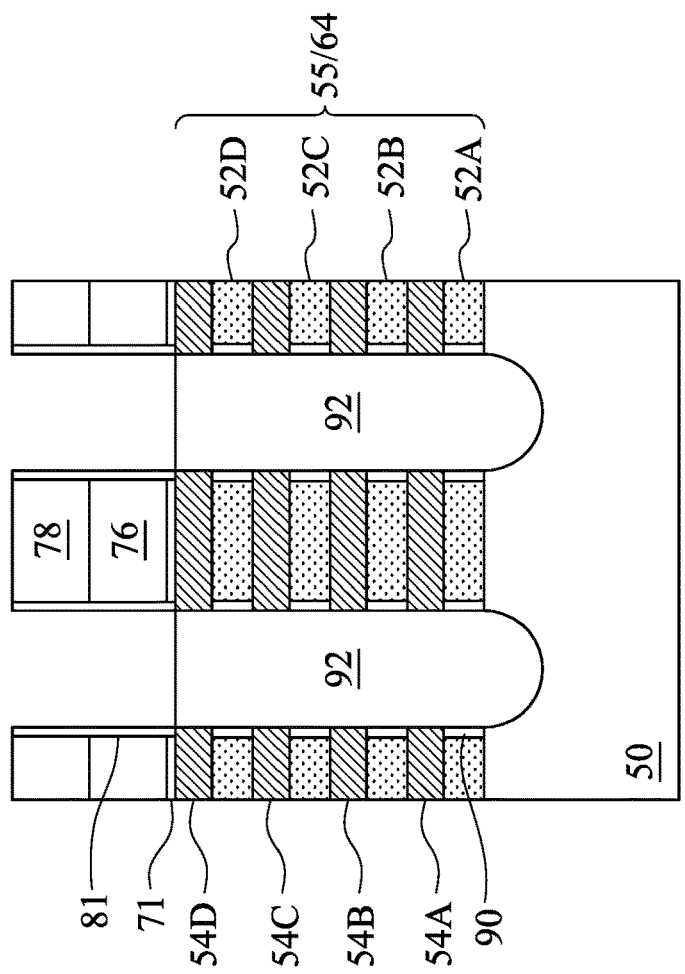
Figure 12C:
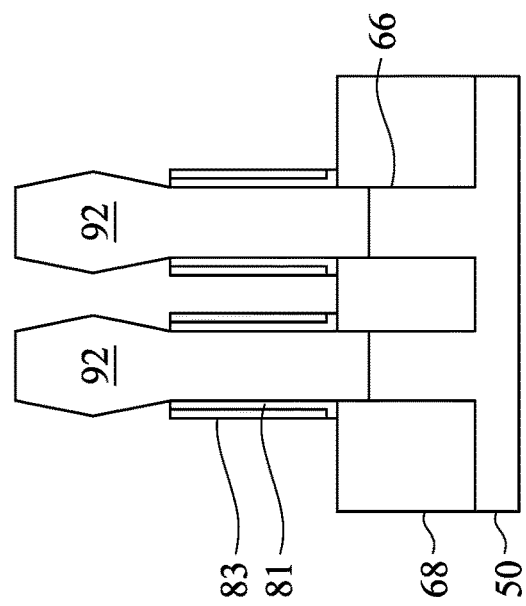

As a result of the epitaxy processes used to form the epitaxial source/drain regions 92 in the regions 50N and the region 50P, upper surfaces of the epitaxial source/drain regions 92 have facets which expand laterally outward beyond sidewalls of the fins 66. In some embodiments, these facets cause adjacent epitaxial source/drain regions 92 of a same nano-FET to merge as illustrated by FIG. 12B. In other embodiments, adjacent epitaxial source/drain regions 92 remain separated after the epitaxy process is completed as illustrated by FIG. 12C. In the embodiments illustrated in FIGS. 12B and 12C, the first spacers 81 and the second spacers 83 are formed covering a portion of the sidewalls of the fins 66 that extend above the STI regions 68 thereby blocking the epitaxial growth. In some other embodiments, the spacer etch used to form the first spacers 81 and the second spacers 83 may be adjusted to remove the spacer material to allow the epitaxially grown region to extend to the surfaces of the STI regions 68.

The epitaxial source/drain regions 92, and/or the multi-layer stack 64 may be implanted with dopants to form source/drain regions, similar to the process previously discussed for forming lightly-doped source/drain regions, followed by an anneal. The source/drain regions may have an impurity concentration from about $10^{19}$ atoms/cm$^3$ to about $10^{21}$ atoms/cm$^3$. The n-type and/or p-type impurities for source/drain regions may be any of the impurities previously discussed. In some embodiments, the epitaxial source/drain regions 92 may be in situ doped during growth.

Figure 13B:
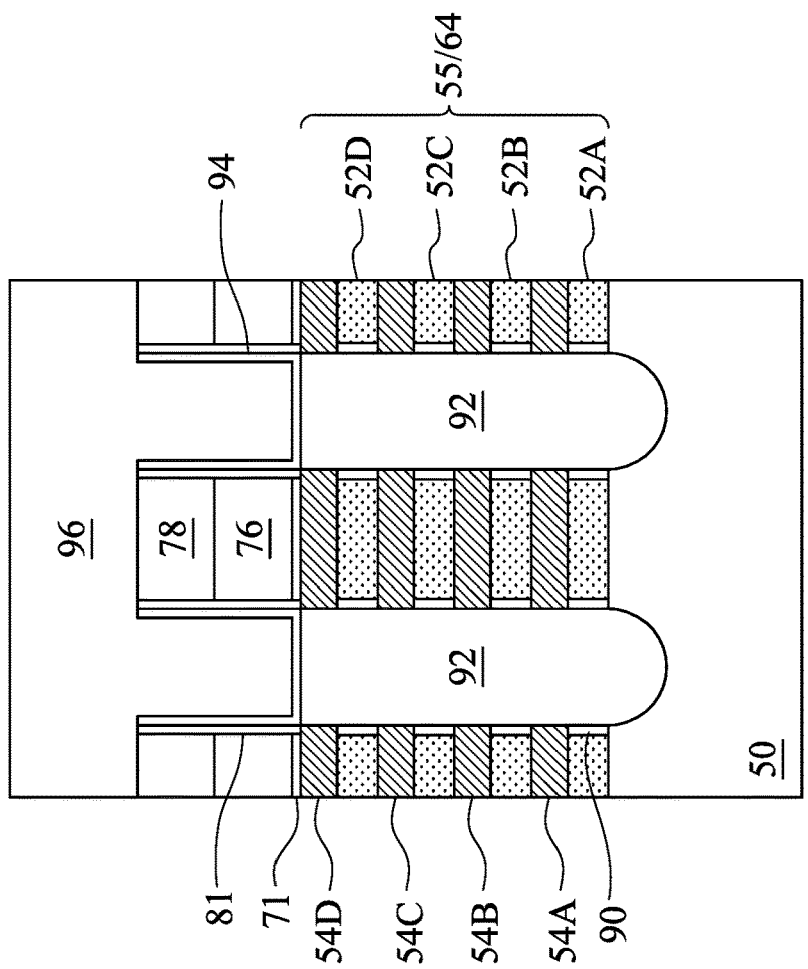
Figure 13A:
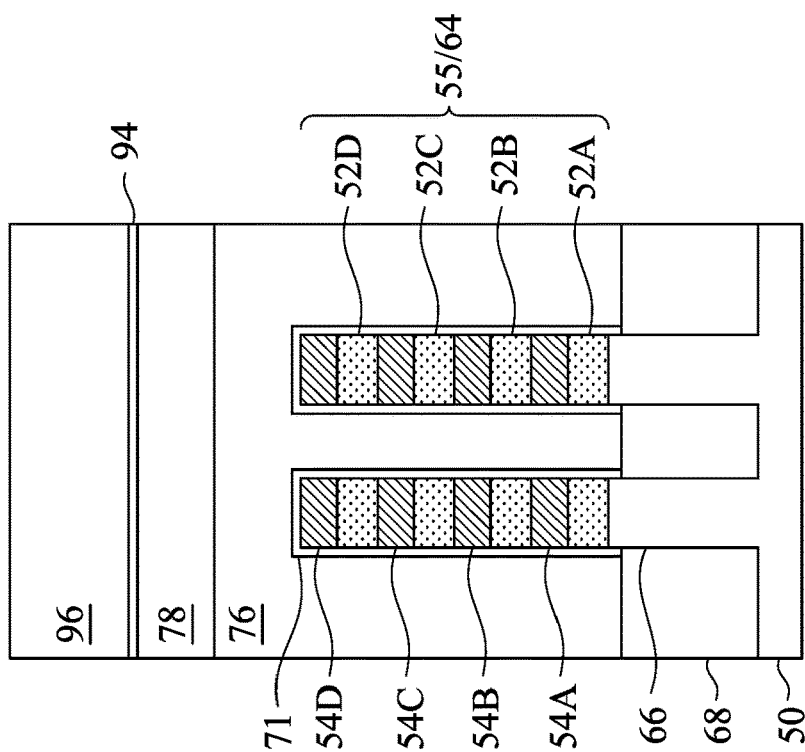

In FIGS. 13A and 13B, a first interlayer dielectric (ILD) 96 is deposited over the structure illustrated in FIGS. 12A through 12D. The first ILD 96 may be formed of a dielectric material, and may be deposited by any suitable method, such as CVD, plasma-enhanced CVD (PECVD), or FCVD. Dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used. In some embodiments, a contact etch stop layer (CESL) 94 is disposed between the first ILD 96 and the epitaxial source/drain regions 92, the masks 78, the first spacers 81 and the second spacers 83. The CESL 94 may comprise a dielectric material, such as, silicon nitride, silicon oxide, silicon oxynitride, or the like, having a different etch rate than the material of the overlying first ILD 96.

Figure 14B:
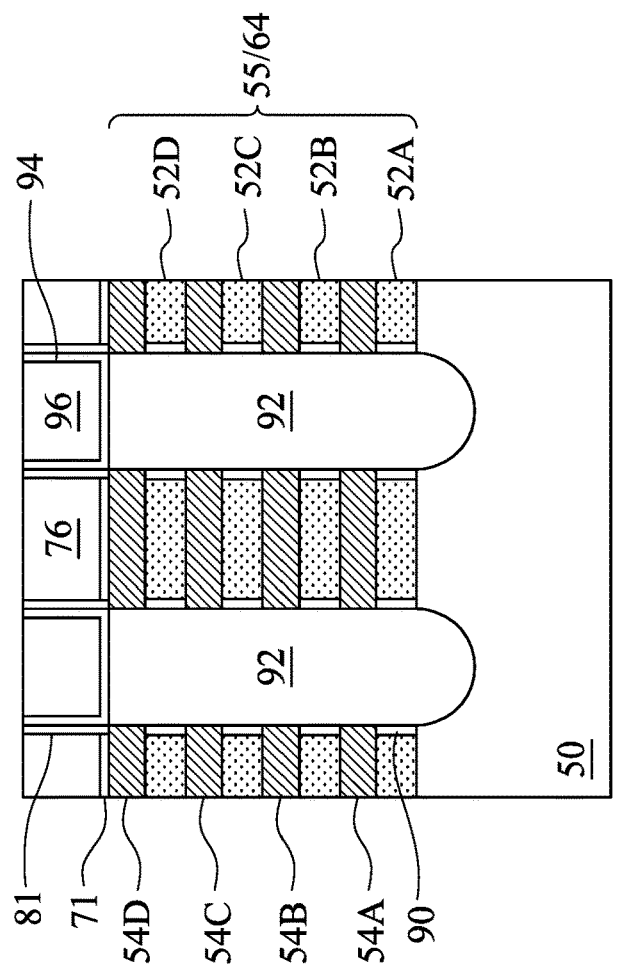
Figure 14A:
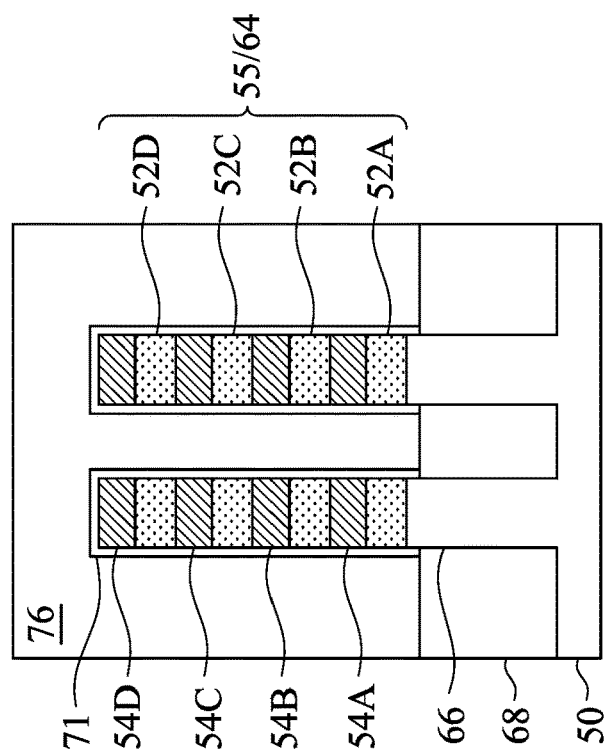

In FIGS. 14A and 14B, a planarization process, such as a CMP, may be performed to level the top surface of the first ILD 96 with the top surfaces of the dummy gates 76 or the masks 78. The planarization process may also remove the masks 78 on the dummy gates 76, and portions of the first spacers 81 along sidewalls of the masks 78. After the planarization process, top surfaces of the dummy gates 76, the first spacers 81, and the first ILD 96 are level. Accordingly, the top surfaces of the dummy gates 76 are exposed through the first ILD 96. In some embodiments, the masks 78 may remain, in which case the planarization process levels the top surface of the first ILD 96 with top surface of the masks 78, and the first spacers 81.

Figure 15B:
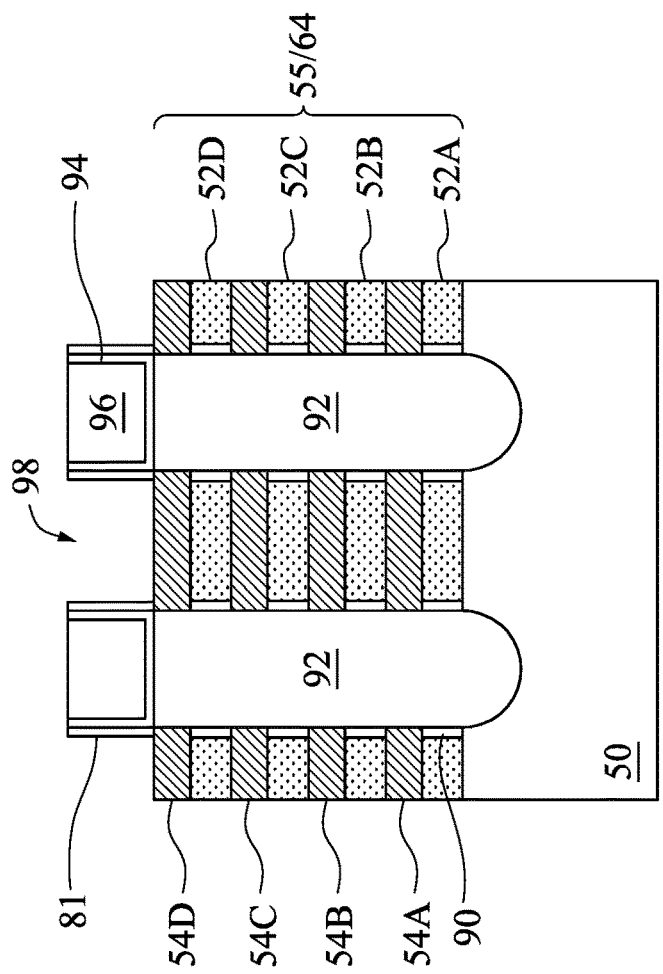
Figure 15A:
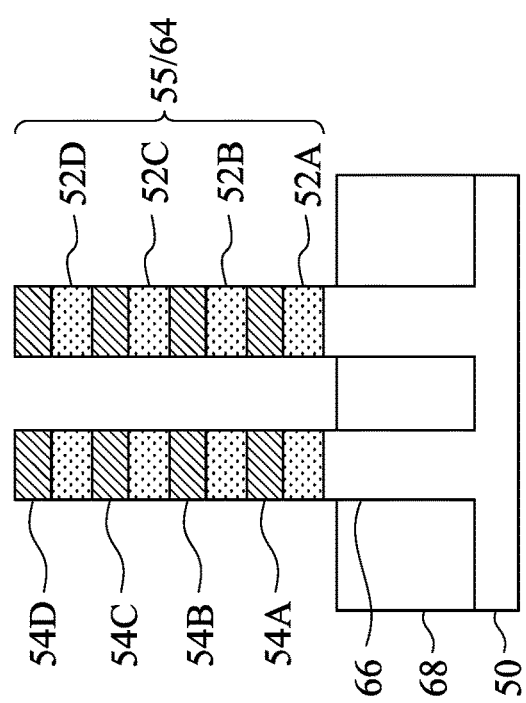

In FIGS. 15A and 15B, the dummy gates 76, and the masks 78 if present, are removed in an etching step(s), so that recesses 98 are formed. Portions of the dummy gate dielectrics 71 in the recesses 98 may also be removed. In some embodiments, only the dummy gates 76 are removed and the dummy gate dielectrics 71 remain and are exposed by the recesses 98. In some embodiments, the dummy gate dielectrics 71 are removed from recesses 98 in a first region of a die (e.g., a core logic region) and remains in recesses 98 in a second region of the die (e.g., an input/output region). In some embodiments, the dummy gates 76 are removed by an anisotropic dry etch process. For example, the etching process may include a dry etch process using reaction gas(es) that selectively etch the dummy gates 76 without etching the first ILD 96 and the first spacers 81. Each recess 98 exposes and/or overlies the multi-layer stacks 64. Portions of the multi-layer stacks 64 are disposed between neighboring pairs of the epitaxial source/drain regions 92. During the removal, the dummy gate dielectrics 71 may be used as an etch stop layer when the dummy gates 76 are etched. The dummy gate dielectrics 71 may then be optionally removed after the removal of the dummy gates 76.

Figure 16B:
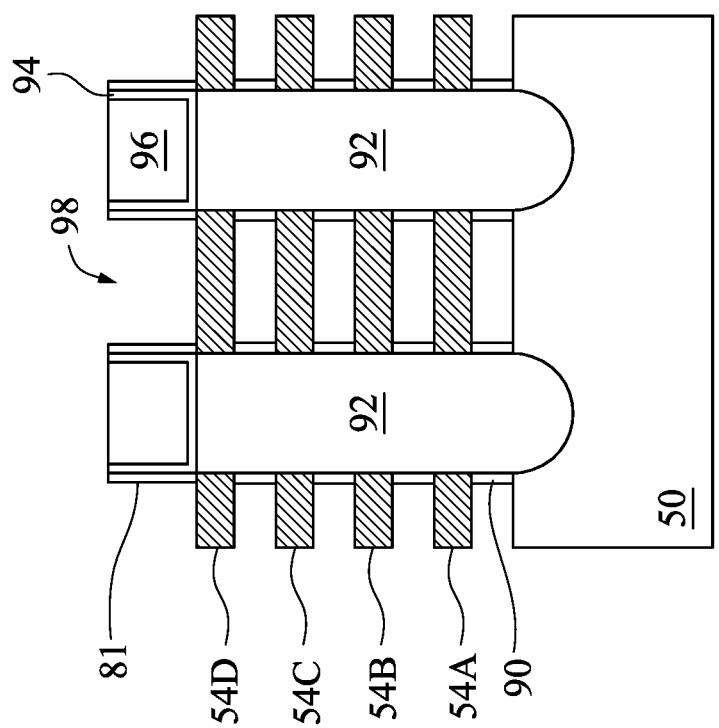
Figure 16A:
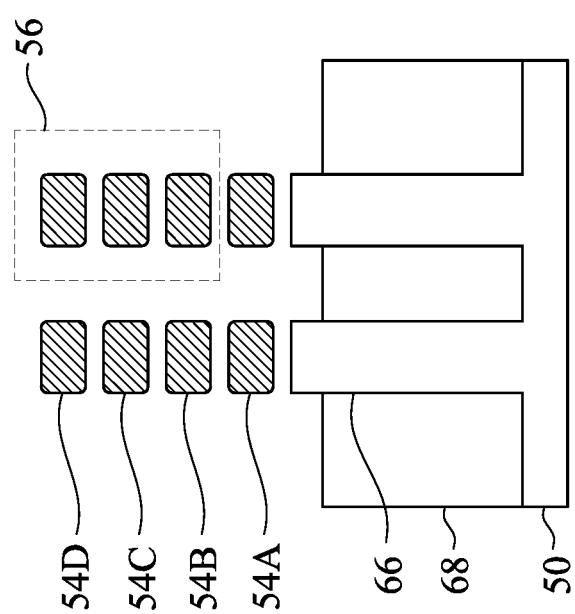

In FIGS. 16A and 16B, the first nanostructures 52A, 52B, 52C and 52D are removed from the regions 50N and the region 50P. The first nanostructures 52A, 52B, 52C and 52D may be removed by isotropic etching processes such as wet etching, dry etching, or the like. The etchants used to remove the first nanostructures 52A, 52B, 52C and 52D may be selective to the materials of the second nanostructures 54A, 54B, 54C and 54D. The second nanostructures 54A, 54B, 54C and 54D may also be subsequently referred to as channel layers 54A, 54B, 54C and 54D, respectively. In an embodiment in which first nanostructures 52A, 52B, 52C and 52D comprise the first semiconductor material (e.g., SiGe, or the like) and the second nanostructures 54A, 54B, 54C and 54D comprise the second semiconductor material (e.g., Si, SiC, or the like), an fluorine-based etchant, such as, hydrogen fluoride (HF), a fluorine based gas, or the like may be used remove layers of the multi-layer stack 64 in the regions 50N and region 50P.

Figure 17B:
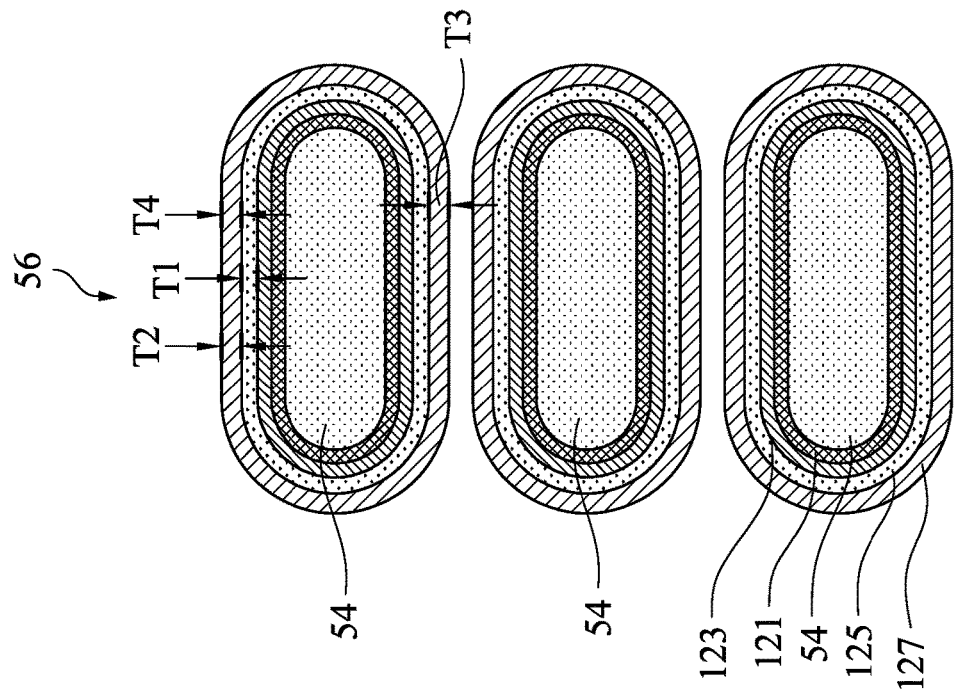
Figure 17A:
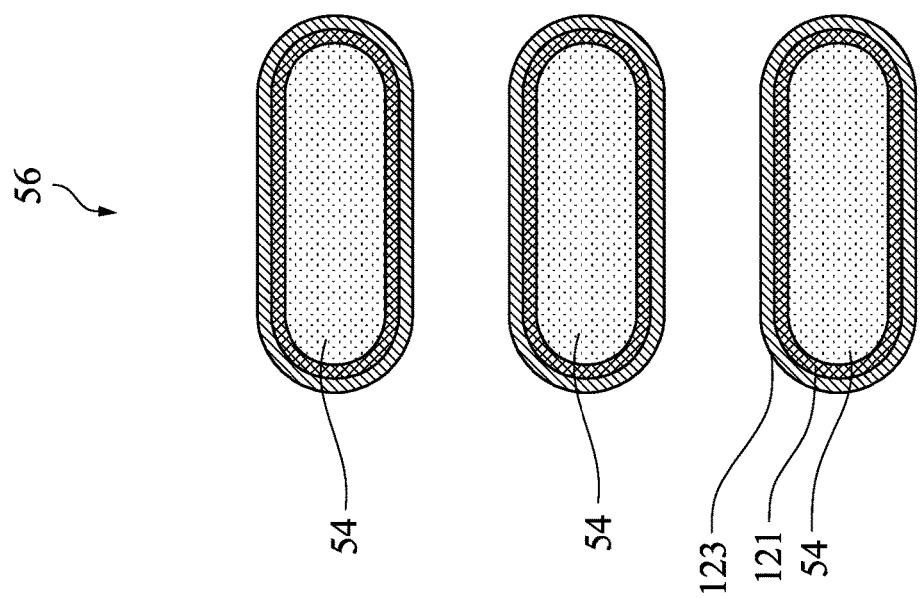
Figure 17C:
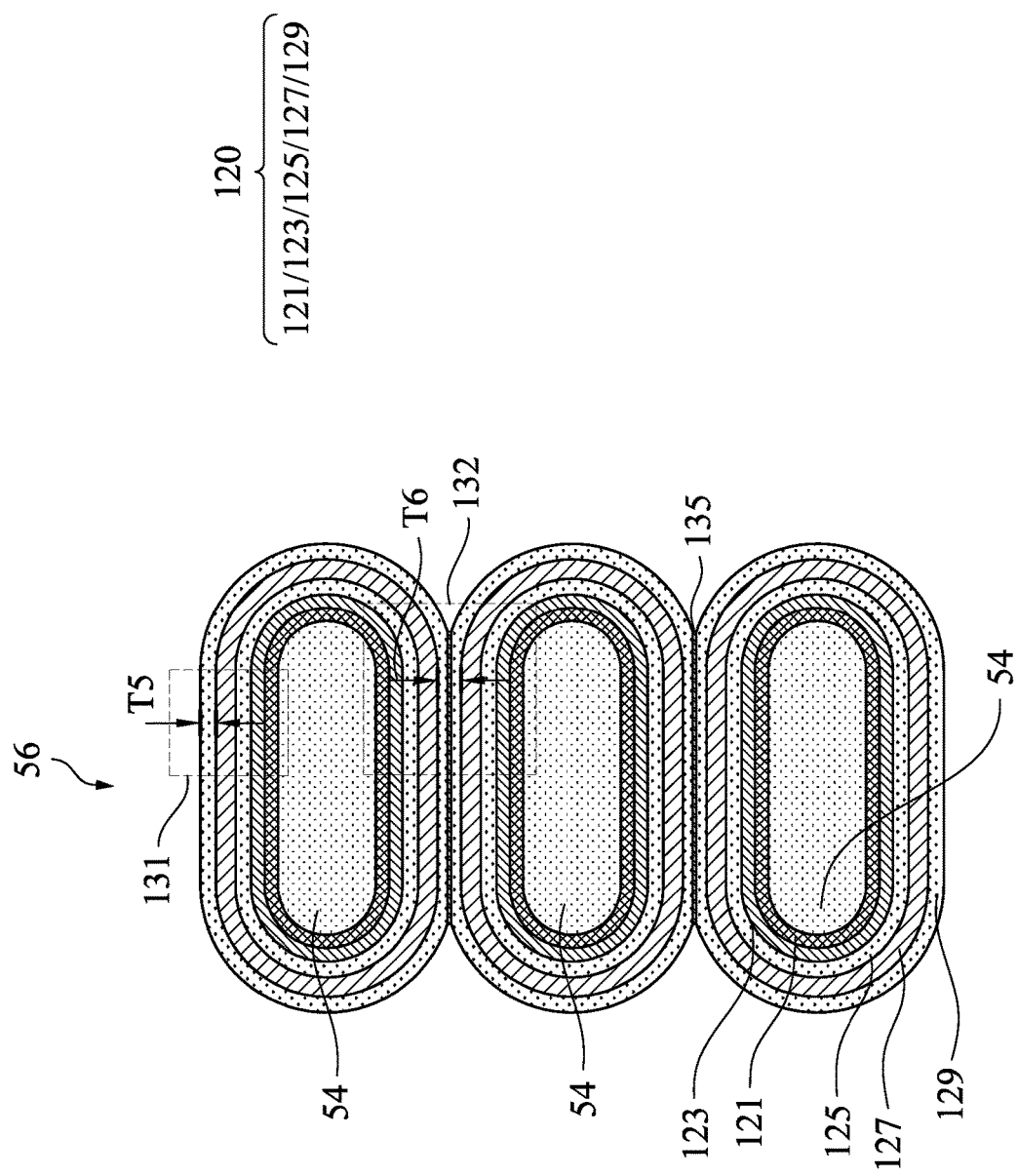
Figure 17E:
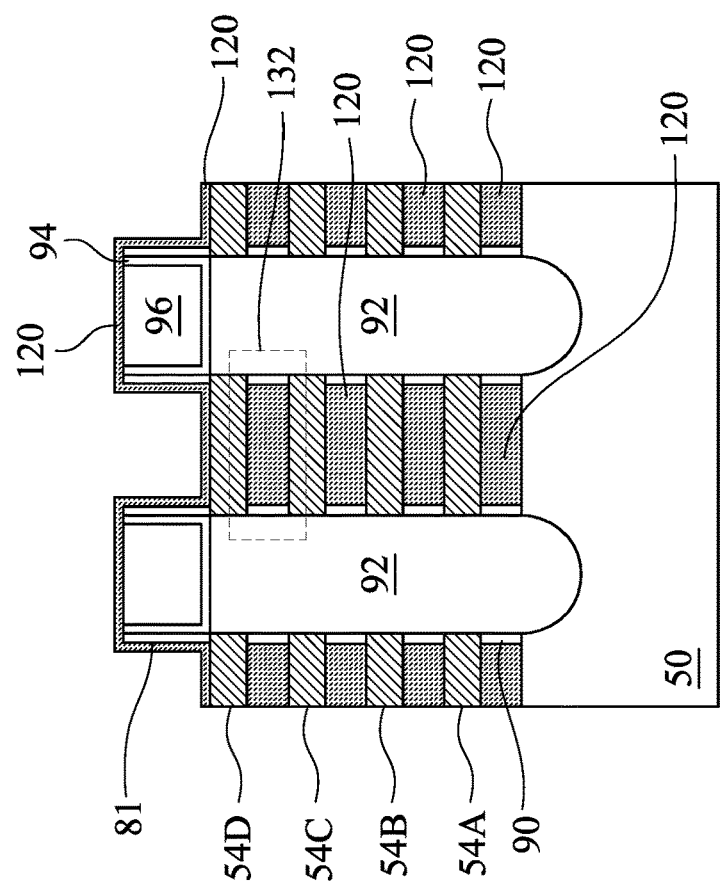
Figure 17D:
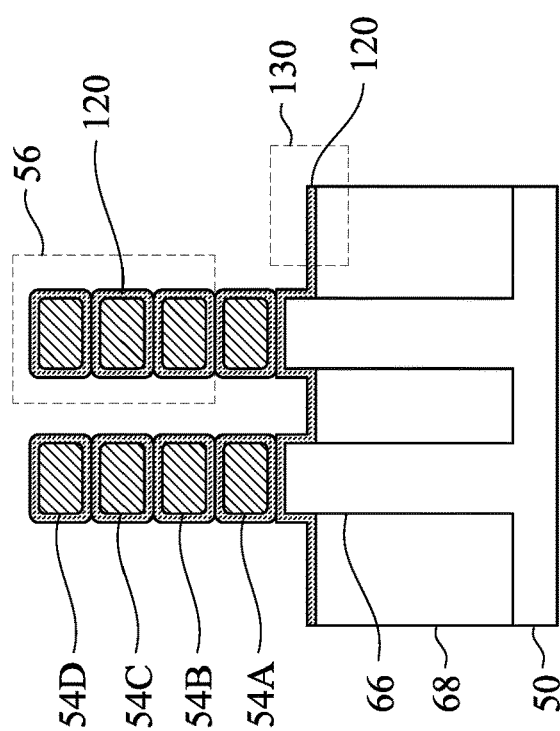

FIGS. 17A through 17C illustrate a region 56 of FIG. 16A, which show subsequent processing steps to form the gate layer stack 120 (shown subsequently in FIGS. 17D through 17F) conformally in the recesses 98. The gate stack layer 120 may be formed around each of the second nanostructures 54A, 54B, 54C and 54D and along sidewalls of the recesses 98, where the gate layer stack 120 includes an interfacial dielectric material 121, a gate dielectric material 123, a work function material 125, a first capping material 127, and a second capping material 129. The different constituent materials of the gate layer stack 120 are also formed over the exposed surfaces of the fins 66, the upper surface of the STI regions 68, on top surfaces of the first ILD 96, the CESL 94, and on top surfaces and sidewalls of the first spacers 81.

Referring to FIG. 17A, an interfacial dielectric material 121 and a gate dielectric material 123 are successively formed around each of the second nanostructures 54. The interfacial dielectric material 121 is a suitable dielectric material, such as silicon oxide formed by a suitable method, such as CVD, PVD, ALD, thermal oxidation, or the like. In an embodiment, the interfacial dielectric material 121 is formed by converting an exterior portion of the second nanostructures 54 (e.g., silicon) into an oxide (e.g., silicon oxide) through a thermal oxidization process. In an embodiment, a thickness of the interfacial dielectric material 121 may be in a range form 5 Å to 25 Å.

After the formation of the interfacial dielectric material 121, the gate dielectric material 123 is formed (e.g., conformally) around each of the second nanostructures 54 and around the interfacial dielectric material 121. In accordance with some embodiments, the gate dielectric material 123 comprises silicon oxide, silicon nitride, or multilayers thereof. In some embodiments, the gate dielectric material 123 includes a high-k dielectric material, and in these embodiments, the gate dielectric material 123 may have a k value greater than about 7.0, and may include a metal oxide or a silicate of Hf, Al, Zr, La, Mg, Ba, Ti, or Pb, or combinations thereof. The formation methods of the gate dielectric material 123 may include Molecular-Beam Deposition (MBD), ALD, PECVD, and the like. In an embodiment, the gate dielectric material 123 may have a thickness that is in a range form 7 Å to 30 Å.

In FIG. 17B, the work function material 125 is formed around each of the second nanostructures 54, and around the interfacial dielectric material 121 and the gate dielectric material 123. In an embodiment in which p-type devices are being formed (e.g., such as PMOS transistors), the work function material 125 may comprise one or more p-type work function materials (may also be referred to as a p-type work function metals) that include TiN, TaN, TiAlN, TiSiN, other suitable p-type work function materials, or combinations thereof. In an embodiment in which n-type devices are being formed (e.g., such as NMOS transistors), the work function material 125 may comprise one or more n-type work function materials (may also be referred to as a n-type work function metals) that include TiAl, TaAl, other suitable n-type work function materials, or combinations thereof. A work function value is associated with the material composition of the work function material 125, and thus, the work function material is chosen to tune its work function value so that a target threshold voltage $V_{TH}$ is achieved in the device that is to be formed. The work function material 125 may be deposited by ALD, CVD, physical vapor deposition (PVD), and/or other suitable process. In some embodiments, the work function material 125 may be a singular layer having a same material composition throughout. For example, in an embodiment in which p-type devices are formed, the work function material 125 may be formed of TiN, TaN, TiAlN, TiSiN, or the like that may have a thickness T1 in a range from 3 Å to 25 Å. As another example, in an embodiment in which n-type devices are formed, the work function material 125 may comprise TiAl, TaAl, or the like that may have a thickness that is in a range from 10 Å to 50 Å. In some embodiments, the work function material 125 is a multilayer structure comprising two or more layers of different materials. For example, in an embodiment, the work function material 125 may be formed by sequentially depositing two or more materials from the list of TiN, TaN, TiAlN, TiSiN, TiAl, TaAl, or the like, where the materials deposited are different from each other. In an embodiment, the work function material 125 may be formed by sequentially depositing three materials from the list of TiN, TaN, TiAlN, TiSiN, TiAl, TaAl, or the like, where each of the materials deposited are different from the other materials deposited. In an embodiment, the work function material 125 may be formed by sequentially depositing a first material, a second material, and a third material from the list of TiN, TaN, TiAlN, TiSiN, TiAl, TaAl, or the like, where the first material deposited and the third material deposited are the same, and the second material deposited is different from the first material and the third material deposited.

Still referring to FIG. 17B, after the formation of the work function material 125, the first capping material 127 is formed (e.g., conformally) around each of the second nanostructures 54 and around the interfacial dielectric material 121, the gate dielectric material 123 and the work function material 125. The first capping material 127 may comprise a semiconductor material, such as silicon or the like. Any suitable formation method, such as ALD, PVD, CVD, or the like, may be used to form the first capping material 127. In an embodiment, the first capping material 127 may have a thickness T2 that is in a range from 5 Å to 30 Å. In an embodiment, a silicon-containing precursor, such as silane, disilane, or the like, may be used to form substantially pure silicon as the first capping material 127. In an embodiment, the first capping material 127 is silicon oxide, and may be formed by forming silicon first, then oxidizing the silicon formed to form silicon oxide as the first capping material 127. After the deposition of the first capping material 127, a space remains between adjacent second nanostructures 54 that prevents the first capping material 127 between adjacent nanostructures 54 from merging and coming into physical contact. In an embodiment, the capping material 127 is a relatively conformal layer with a substantially uniform thickness on all sides of each of the second nanostructures 54. For example, a ratio of a first thickness T3 of the first capping material 127 at a first location between adjacent second nanostructures 54 to a second thickness T4 of the first capping material 127 over the uppermost second nanostructure 54 is in a range from 0.25 to 2.

In FIG. 17C, the second capping material 129 is formed (e.g., conformally) around each of the second nanostructures 54 and around the interfacial dielectric material 121, the gate dielectric material 123, the work function material 125 and the first capping material 127. The second capping material 129 may be deposited by ALD, CVD, physical vapor deposition (PVD), and/or other suitable process. In a region 131, the second capping material 129 may have a thickness T5. In an embodiment, the second capping material 129 may comprise TiN, and the thickness T5 may be in a range from 3 Å to 25 Å. In an embodiment, the second capping material 129 may be a singular layer having a same material composition throughout and may comprise TaN, TiAlN, TiSiN, TiAl, TaAl, or the like. In some embodiments, the second capping material 129 may have a same material composition as the work function material 125. For example, in an embodiment where the work function material 125 comprises TiN, the second capping material 129 likewise comprises TiN. As another example, in an embodiment where the work function material 125 comprises TiAl, the second capping material 129 likewise comprises TiAl. In other embodiments, the second capping material 129 may comprise a different material than the work function material 125.

In some embodiment, the second capping material 129 is a multilayer structure comprising two or more layers of different materials and may comprise more than one material from the list of TiN, TaN, TiAlN, TiSiN, TiAl, TaAl, or the like. For example, in an embodiment, the second capping material 129 may be formed by sequentially depositing two or more materials from the list of TiN, TaN, TiAlN, TiSiN, TiAl, TaAl, or the like, where the materials deposited are different from each other. In an embodiment, the second capping material 129 may be formed by sequentially depositing three materials from the list of TiN, TaN, TiAlN, TiSiN, TiAl, TaAl, or the like, where each of the materials deposited is different from the other materials deposited. In an embodiment, the second capping material 129 may be formed by sequentially depositing a first material, a second material and a third material from the list of TiN, TaN, TiAlN, TiSiN, TiAl, TaAl, or the like, where the first material deposited and the third material deposited are the same, and the second material deposited is different from the first material and the third material deposited.

Figure 17F:
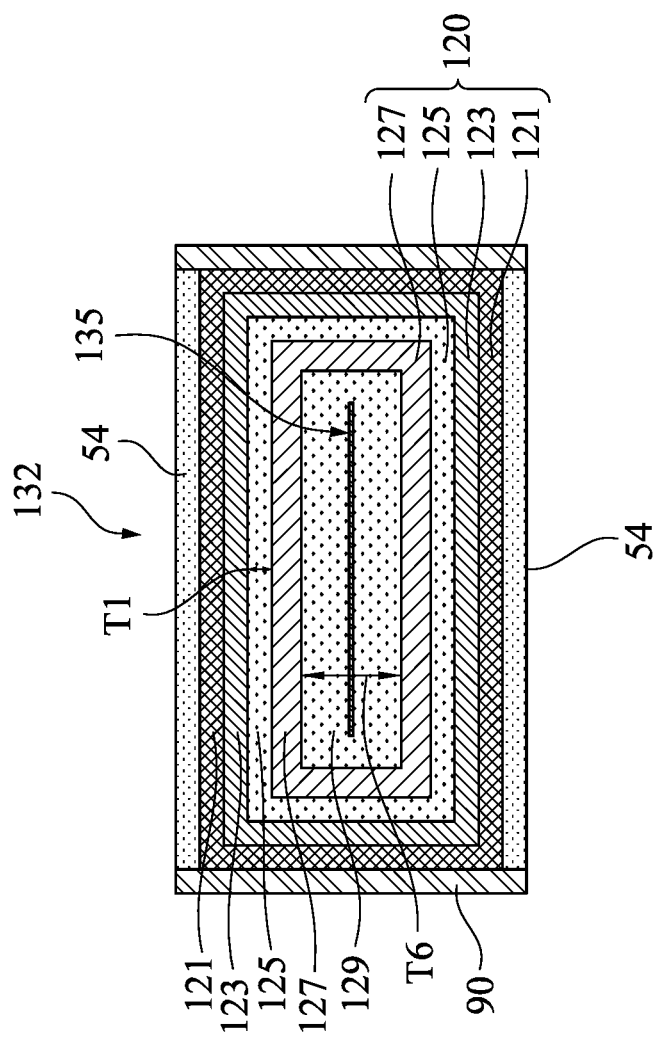

Still referring to FIG. 17C, the second capping material 129 between adjacent second nanostructures 54 may be deposited until they merge together (e.g., physically contacts each other), thereby filling a remaining space between adjacent second nanostructures 54 and forming a seam 135. For example, in a region 132 shown in FIGS. 17C and 17E, which is an area between adjacent second nanostructures 54, the gate materials 120 (e.g., made up of the interfacial dielectric material 121, the gate dielectric material 123, the work function material 125, the first capping material 127, and the second capping material 129) completely fills the space between adjacent second nanostructures 54. As a result, the subsequently formed fill material (shown subsequently in FIGS. 18A and 18B) does not extend into the space between adjacent second nanostructures 54. In other words, the space between adjacent second nanostructures 54 is free of this subsequently formed gate electrode fill material. FIG. 17F shows a detailed view of the region 132 in the same cross-section as FIG. 17E. A list of the materials between two adjacent second nanostructures 54 in the region 132 therefore includes in this order: the interfacial dielectric material 121, the gate dielectric material 123, the work function material 125, the first capping material 127, the (merged) second capping material 129, the first capping material 127, the work function material 125, the gate dielectric material 123, and the interfacial dielectric material 121.

Further in FIG. 17C, the second capping material 129 in the region 131 has the thickness T5, while in the region 132, the (merged) second capping material 129 has a thickness T6 that is larger than the thickness T5. This is because, as discussed above, in the region 132, the gate layer stack 120 around two adjacent second nanostructures 54 merge (e.g., come into physical contact) and form a thicker (merged) gate layer stack 120. In addition, since the second capping material 129 between adjacent second nanostructures 54 is merged together, the (merged) second capping material 129 between adjacent second nanostructures 54 (e.g., in region 132) is thicker than the second capping material 129 at other locations, such as over the uppermost second nanostructure 54 (e.g., in the region 131), or along sidewalls of the second nanostructures 54. Because the (merged) second capping material 129 separates the first capping material 127 and the work function material 125 around a second nanostructure 54 from the first capping material 127 and the work function material 125 around an adjacent second nanostructure 54, this allows the first capping material 127 and the work function material 125 around each respective second nanostructure 54 to remain conformal with a substantially uniform thickness (e.g., uniform within the constraints of manufacturing processes). Therefore, a sum of the thickness T1 of the work function material 125 and the thickness T2 of the first capping material 127 in the region 132 is substantially equal to the sum of the thickness T1 of the work function material 125 and the thickness T2 of the first capping material 127 in the region 131.

Advantages can be achieved as a result of the formation of the first capping material 127 around the work function material 125 that surrounds each of two adjacent second nanostructures 54, followed by the formation of the second capping material 129 around the first capping material 127. These advantages include preventing the first capping material 127 of each of the two adjacent second nanostructures 54 from merging together and allowing for a more uniform thickness of the first capping material 127 and the work function material 125 at all locations, thereby reducing threshold voltage $V_{TH}$ variation and improving device performance.

Figure 17G:
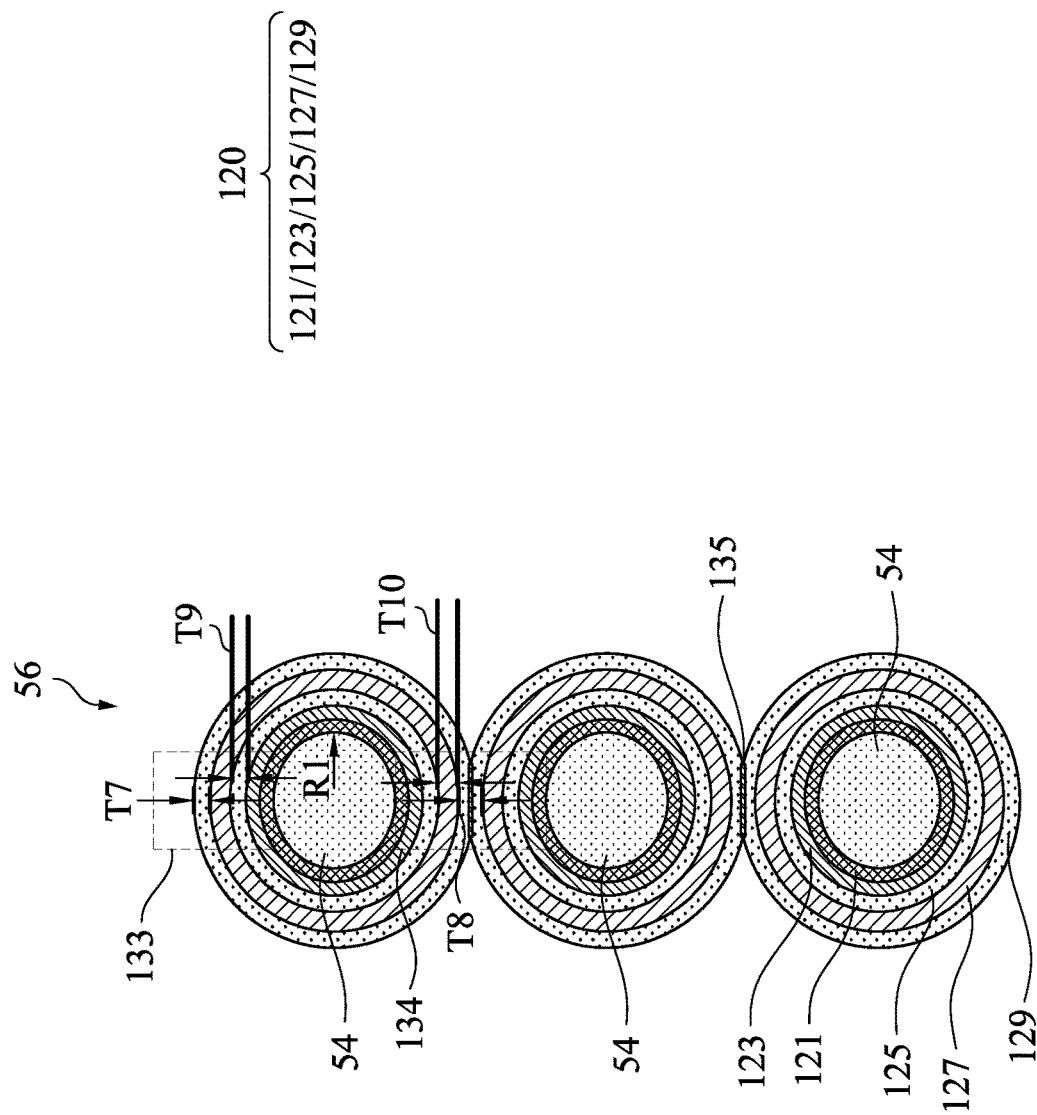
FIG. 17G is a cross-sectional view of an intermediate stage in the manufacturing of nano-FETs, in accordance with alternate embodiments.

In the above embodiments illustrated in FIGS. 1 through 17F, the nanostructures 54 may be nanosheets having a rounded, rectangular cross-section. In FIG. 17G, an alternate embodiment is illustrated in which the second nanostructures 54A, 54B, 54C and 54D may be nanowires having a circular cross-section with a radius R1. Unless specified otherwise, like reference numerals in this embodiment represent like components in the embodiment shown in FIGS. 17A through 17F formed by like processes. Accordingly, the process steps and applicable materials may not be repeated herein. The gate layer stack 120 is formed around each of the second nanostructures 54A, 54B, 54C and 54D in a similar manner as described above in FIGS. 17A through 17F. The gate layer stack 120 includes the interfacial dielectric material 121, the gate dielectric material 123, the work function material 125, the first capping material 127, and the second capping material 129. Further in FIG. 17G, the second capping material 129 in a region 133 has a thickness T7, while in a region 134, the (merged) second capping material 129 has a thickness T8 that is larger than the thickness T7. This is because, as discussed above in FIGS. 17A through 17F, the gate layer stack 120 around two adjacent second nanostructures 54 merge (e.g., come into physical contact) and form a thicker (merged) gate layer stack 120. In addition, since the second capping material 129 between adjacent second nanostructures 54 is merged together, the (merged) second capping material 129 between adjacent second nanostructures 54 (e.g., in region 134) is thicker than the second capping material 129 at other locations, such as over the uppermost second nanostructure 54 (e.g., in the region 133), or along sidewalls of the second nanostructures 54. Because the (merged) second capping material 129 separates the first capping material 127 and the work function material 125 around a second nanostructure 54 from the first capping material 127 and the work function material 125 around an adjacent second nanostructure 54, this allows the first capping material 127 and the work function material 125 around each respective second nanostructure 54 to remain conformal with a substantially uniform thickness (e.g., uniform within the constraints of manufacturing processes). Therefore, a sum of a thickness T9 of the work function material 125 and a thickness T10 of the first capping material 127 in the region 133 is substantially equal to the sum of the thickness T9 of the work function material 125 and the thickness T10 of the first capping material 127 in the region 134.

Advantages can be achieved as a result of the formation of the first capping material 127 around the work function material 125 that surrounds each of two adjacent second nanostructures 54, followed by the formation of the second capping material 129 around the first capping material 127. These advantages include preventing the first capping material 127 of each of the two adjacent second nanostructures 54 from merging together and allowing for a more uniform thickness of the first capping material 127 and the work function material 125 at all locations. In addition, the disclosed method reduces threshold voltage $V_{TH}$ variation, thereby improving device performance.

Figure 18B:
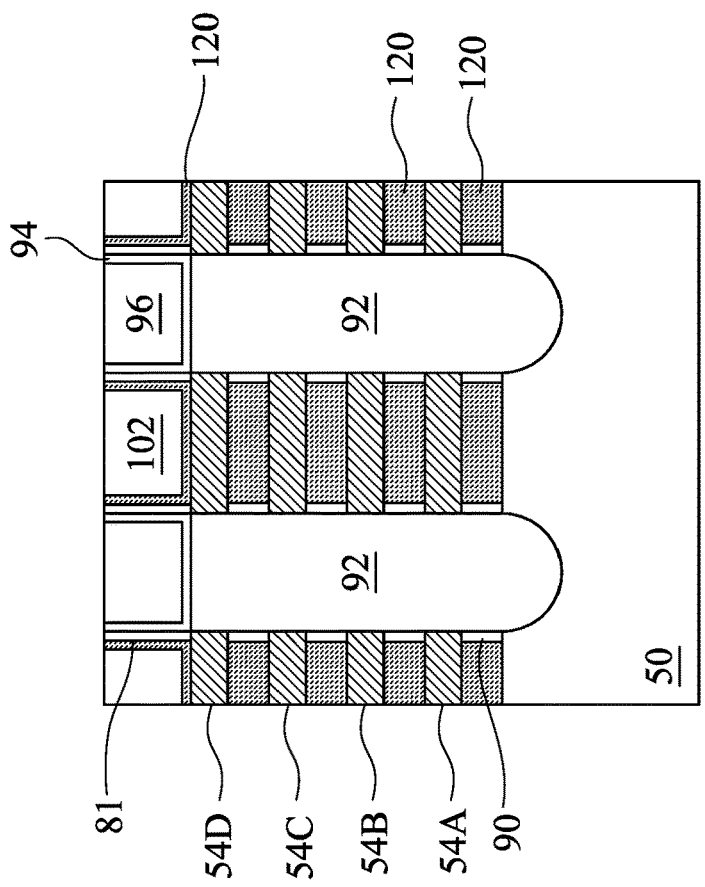
FIGS. 18A, 18B, 19A, 19B, 20A, 20B, 21A, and 21B are cross-sectional views of intermediate stages in the manufacturing of nano-FETs, in accordance with some embodiments.
Figure 18A:
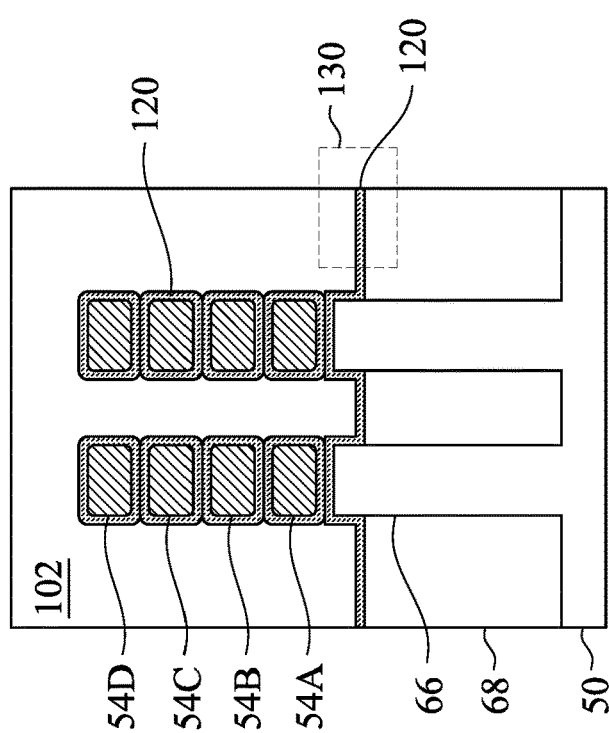

In FIGS. 18A and 18B, the gate electrodes 102 are deposited over the gate layer stack 120, respectively, and fill the remaining portions of the recesses 98. The gate electrodes 102 may include a metal-containing material such as titanium nitride, titanium oxide, tantalum nitride, tantalum carbide, cobalt, ruthenium, aluminum, tungsten, combinations thereof, or multi-layers thereof. For example, although a single layer gate electrode 102 is illustrated in FIGS. 18A and 18B, the gate electrodes 102 may comprise any number of liner layers, and a fill material. The gate electrodes 102 may be formed by ALD, CVD, PVD, the like, or combinations thereof. In some embodiments, the gate electrodes 102 may be formed by ALD followed by PVD.

After the filling of the recesses 98, a planarization process, such as a CMP, may be performed to remove the excess portions of the gate layer stack 120 and the material of the gate electrodes 102, which excess portions are over the top surface of the first ILD 96. The remaining portions of material of the gate electrodes 102 and the gate layer stack 120 thus form replacement gates of the resulting nano-FETs.

The formation of the gate layer stack 120 in the regions 50N and the region 50P may occur simultaneously such that the gate layer stack 120 in each region is formed from the same materials, and the formation of the gate electrodes 102 may occur simultaneously such that the gate electrodes 102 in each region are formed from the same materials. In some embodiments, the gate layer stack 120 in each region may be formed by distinct processes, such that the gate layer stack 120 may be different materials, and/or the gate electrodes 102 in each region may be formed by distinct processes, such that the gate electrodes 102 may be different materials. Various masking steps may be used to mask and expose appropriate regions when using distinct processes.

Figure 19B:
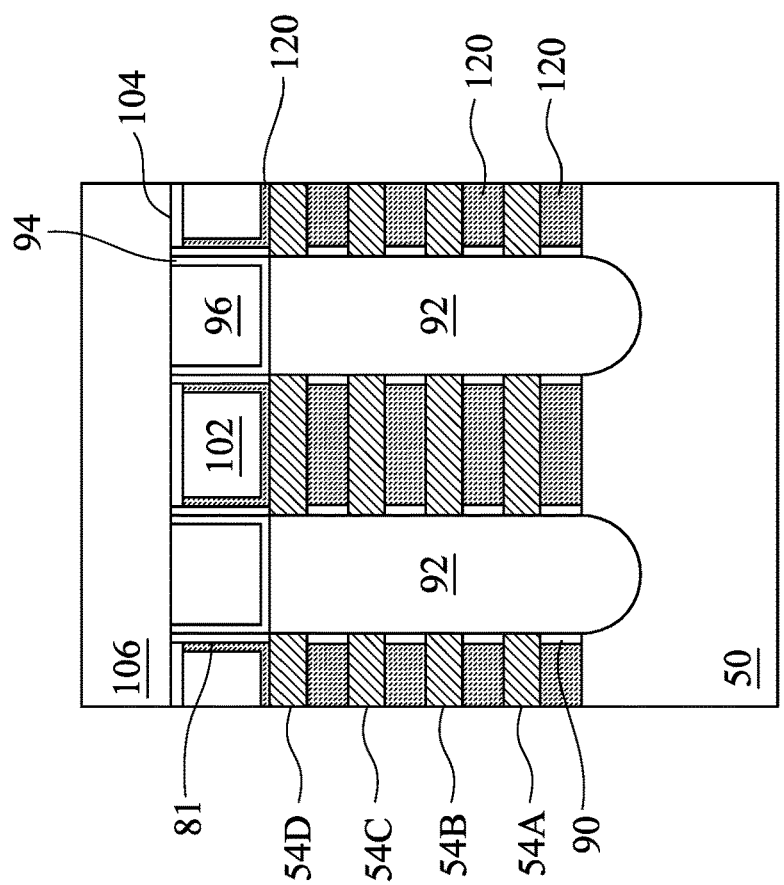
Figure 19A:
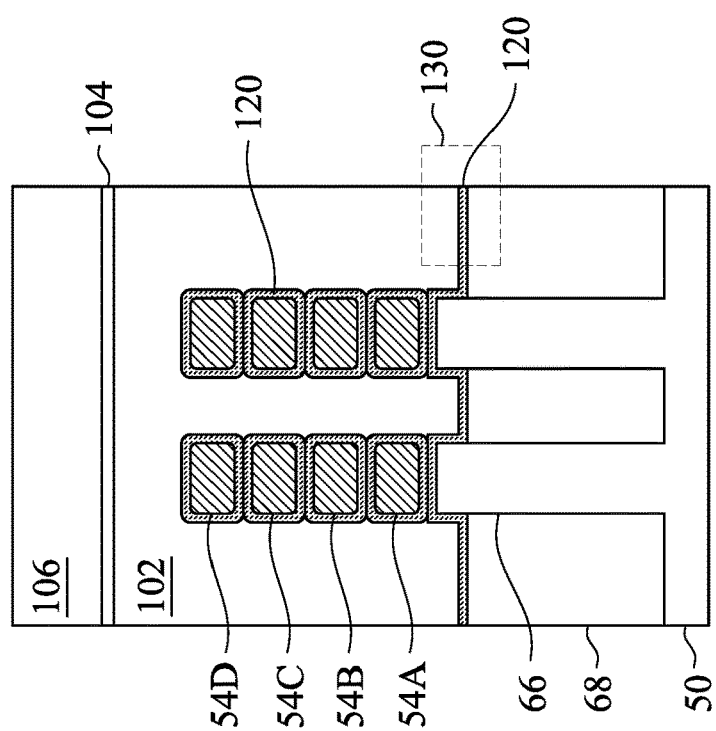

In FIGS. 19A and 19B, a second ILD 106 is deposited over the first ILD 96. In some embodiments, the second ILD 106 is a flowable film formed by a flowable CVD method. In some embodiments, the second ILD 106 is formed of a dielectric material such as PSG, BSG, BPSG, USG, or the like, and may be deposited by any suitable method, such as CVD, PECVD, or the like. In accordance with some embodiments, before the formation of the second ILD 106, the gate layer stack 120 and the gate electrodes 102 are recessed, so that a recess is formed directly between opposing portions of the first spacers 81. A gate mask 104 comprising one or more layers of dielectric material, such as silicon nitride, silicon oxynitride, or the like, is filled in the recess, followed by a planarization process to remove excess portions of the dielectric material extending over the first ILD 96. Subsequently formed gate contacts (such as the gate contacts 114, discussed below with respect to FIGS. 21A and 21B) penetrate through the gate mask 104 to contact the top surface of the recessed gate electrodes 102.

Figure 20B:
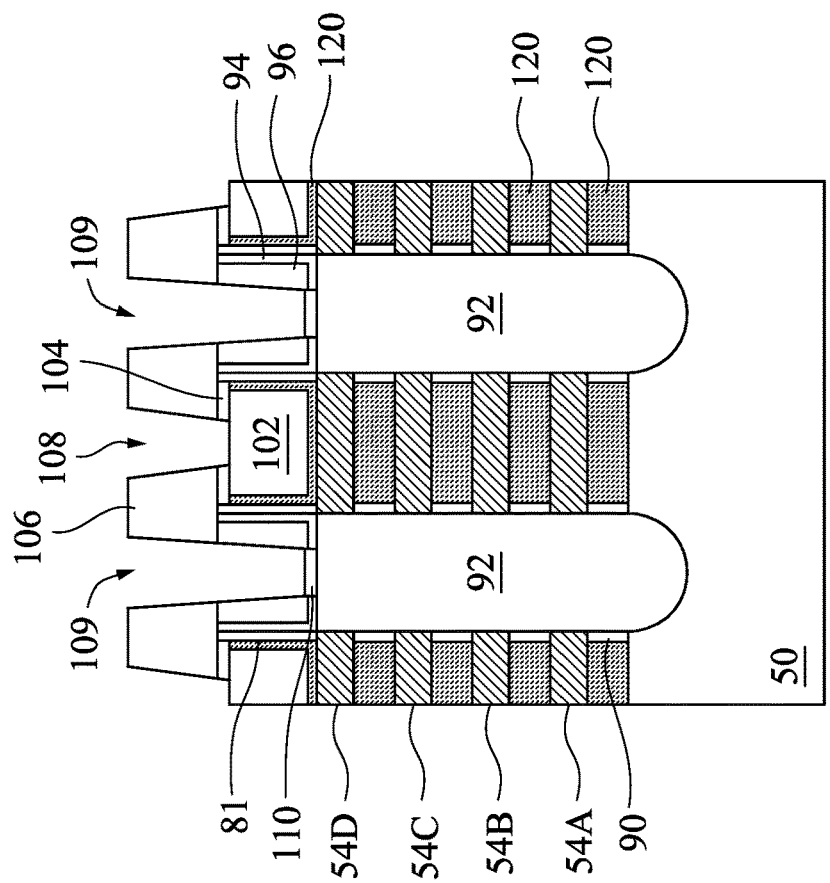
Figure 20A:
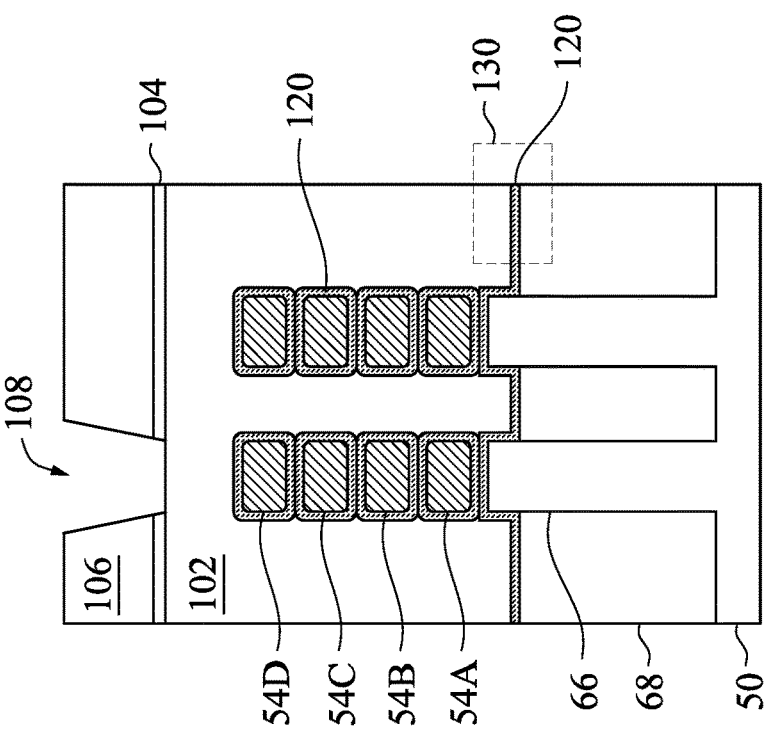

In FIGS. 20A and 20B, openings 108 for gate contacts 114 (shown subsequently in FIGS. 21A and 21B) are formed through the second ILD 106 and the gate mask 104, and openings 109 for source/drain contacts 112 (shown subsequently in FIGS. 21A and 21B) are formed through the second ILD 106 and the first ILD 96. The openings 108 and 109 may be formed using acceptable photolithography and etching techniques. The openings 108 may expose surfaces of the gate structures and the openings 109 may expose surfaces of the epitaxial source/drain regions 92. Silicide regions 110 are formed over the epitaxial source/drain regions 92 by first depositing a metal (not separately illustrated) capable of reacting with the semiconductor materials of the underlying epitaxial source/drain regions 92 (e.g. silicon, silicon germanium, germanium) to form silicide or germanide regions, such as nickel, cobalt, titanium, tantalum, platinum, tungsten, other noble metals, other refractory metals, rare earth metals or their alloys, over the exposed portions of the epitaxial source/drain regions 92, and then performing a thermal anneal process to form the first silicide regions 110. The un-reacted portions of the deposited metal are then removed, e.g., by an etching process.

Figure 21B:
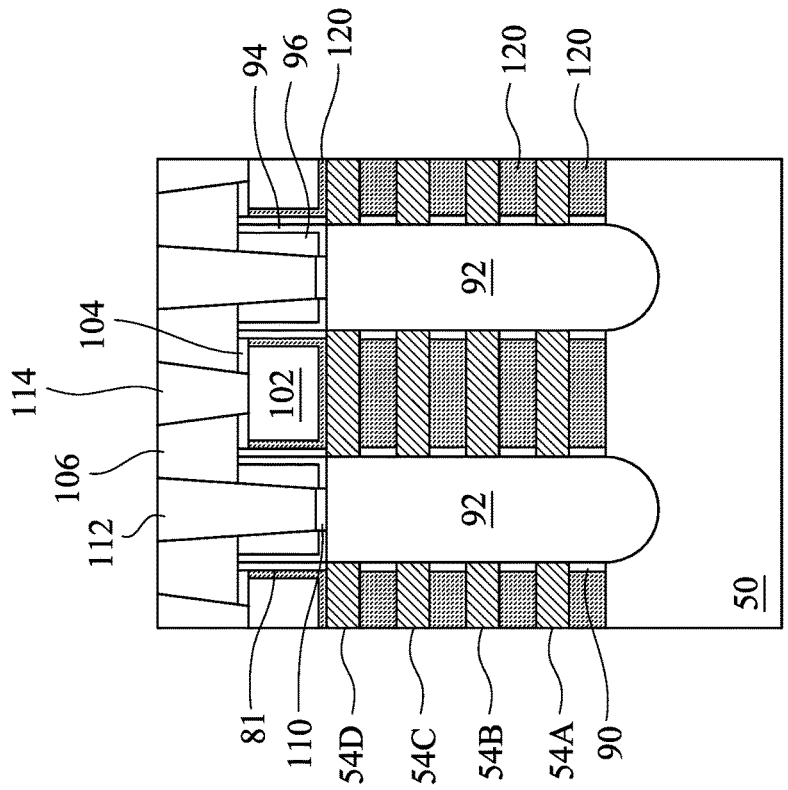
Figure 21A:
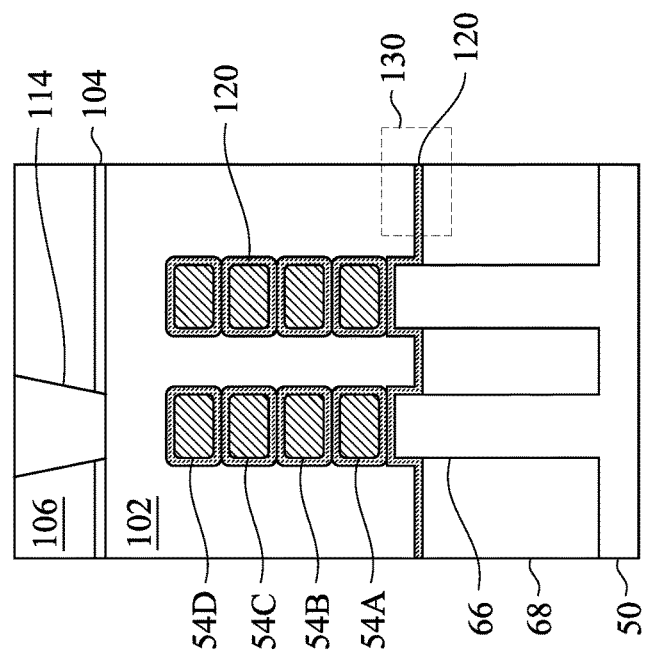

In FIGS. 21A and 21B, a liner, such as a diffusion barrier layer, an adhesion layer, or the like, and a conductive material are formed in the openings 108 and 109. The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the second ILD 106. The remaining liner and conductive material form the gate contacts 114 in the openings 108, and the source/drain contacts 112 in the openings 109. The gate contacts 114 are physically and electrically coupled to the gate electrodes 102, and the source/drain contacts 112 are physically and electrically coupled to the epitaxial source/drain regions 92.

The embodiments of the present disclosure have some advantageous features. The embodiments include the formation of a first capping material around the work function material of a first nanosheet of a nano-FET and the formation of the first capping material around the work function material of a second nanosheet of the nano-FET. Subsequently, a second capping material is formed around the first capping material of the first nanosheet of the nano-FET, and the second capping material is formed around the first capping material of the second nanosheet of the nano-FET. The first and the second nano sheets are adjacent to each other. The second capping material wraps around the first capping material and the work function material that surrounds the first nanosheet. The second capping material wraps around the first capping material and the work function material that surrounds the second nanosheet. The second capping material around the first nanosheet of the nano-FET merges with the second capping material around the second nanosheet of the nano-FET. One or more embodiments disclosed herein may prevent the first capping material around the work function material of the first nanosheet and the first capping material around the work function material of the second nanosheet from merging together and allowing for a more uniform thickness of the first capping material and the work function material at all locations. In addition, the disclosed method reduces threshold voltage $V_{TH}$ variation, thereby improving the performance of the device formed.

In accordance with an embodiment, a semiconductor device includes source/drain regions over a substrate; nanosheets between the source/drain regions; and a gate structure over the substrate and between the source/drain regions, the gate structure including a gate dielectric material around each of the nanosheets; a work function material around the gate dielectric material; a first capping material around the work function material; a second capping material around the first capping material, where the second capping material is thicker at a first location between the nanosheets than at a second location along a sidewall of the nanosheets; and a gate fill material over the second capping material. In an embodiment, the work function material and the second capping material each includes titanium nitride, tantalum nitride, titanium aluminum nitride, titanium silicon nitride, titanium aluminum, tantalum aluminum, or a combination thereof. In an embodiment, the work function material and the second capping material are different. In an embodiment, the work function material and the second capping material are the same. In an embodiment, at the first location a top surface and a bottom surface of the second capping material is in physical contact with the first capping material. In an embodiment, a ratio of a first thickness of the first capping material at the first location to a second thickness of the first capping material over the uppermost nanosheet is in a range from 0.25 to 2. In an embodiment, the space between a bottom surface of an uppermost nanosheet and a top surface of a second nanosheet below the uppermost nanosheet is free of the gate fill material.

In accordance with an embodiment, a semiconductor device includes a gate structure over a semiconductor substrate; source/drain regions over the semiconductor substrate and on opposing sides of the gate structure; and a first channel layer and a second channel layer disposed between the source/drain regions and over the semiconductor substrate, where the first channel layer is between the second channel layer and the semiconductor substrate, where the gate structure includes a gate dielectric material around the first channel layer and around the second channel layer; a work function material around the gate dielectric material; a first capping material around the work function material, where the first capping material includes a semiconductor material, where a first portion of the first capping material is disposed around the first channel layer, where a second portion of the first capping material is disposed around the second channel layer; a second capping material around the first capping material, where the second capping material physically separates the first portion of the first capping material from the second portion of the first capping material; and a gate fill material. In an embodiment, the semiconductor device further includes inner spacers between first end portions of the first channel layer and second end portions of the second channel layer, where the gate dielectric material, the work function material, the first capping material, and the second capping material completely fill a space between the inner spacers. In an embodiment, the first capping material includes silicon. In an embodiment, each of the first channel layer and the second channel layer includes a nanowire having a circular cross-section. In an embodiment, the work function material includes titanium nitride or titanium aluminum, the first capping material includes silicon, and the second capping material includes titanium nitride or titanium aluminum. In an embodiment, the work function material and the second capping material are the same. In an embodiment, the second capping material includes at least three materials that are different from each other. In an embodiment, the semiconductor device further includes an interfacial dielectric material between the gate dielectric material and the first channel layer and between the gate dielectric material and the second channel layer, where the interfacial dielectric material, the gate dielectric material, the work function material, the first capping material, and the second capping material fill a space between the first channel layer and the second channel layer.

In accordance with an embodiment, a method of forming a semiconductor device includes forming source/drain regions over a substrate; forming a first nanosheet and a second nanosheet that are over the substrate, the first nanosheet disposed between the substrate and the second nanosheet; depositing a gate dielectric material around the first nanosheet and the second nanosheet; depositing a work function material around the gate dielectric material, where a first portion of the work function material extends along a first surface of the first nanosheet facing away from the substrate, and a second portion of the work function material extends along a second surface of the second nanosheet facing the substrate; forming a first capping material around the work function material; forming a second capping material around the first capping material; where the first capping material and the second capping material fill a gap between the first portion and the second portion of the work function material; and forming a gate fill material over the first nanosheet and the second nanosheet. In an embodiment, the gap between the first portion and the second portion of the work function material is free of the gate fill material. In an embodiment, the first capping material includes silicon. In an embodiment, the second capping material includes titanium nitride or titanium aluminum. In an embodiment, the method further includes forming an interfacial dielectric material around the first nanosheet and the second nanosheet by converting an exterior portion of the first nanosheet and the second nanosheet into an oxide through a thermal oxidization process.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
   source/drain regions over a substrate;
   nanosheets between the source/drain regions; and
   a gate structure over the substrate and between the source/drain regions, the gate structure comprising:
      a gate dielectric material around each of the nanosheets;
      a work function material around the gate dielectric material;
      a first capping material around the work function material;
      a second capping material around the first capping material, wherein the second capping material is thicker at a first location between the nanosheets than at a second location along a sidewall of the nanosheets; and
      a gate fill material over the second capping material.

2. The semiconductor device of claim 1, wherein the work function material and the second capping material each comprise titanium nitride, tantalum nitride, titanium aluminum nitride, titanium silicon nitride, titanium aluminum, tantalum aluminum, or a combination thereof.

3. The semiconductor device of claim 2, wherein the work function material and the second capping material are different.

4. The semiconductor device of claim 2, wherein the work function material and the second capping material are the same.

5. The semiconductor device of claim 1, wherein at the first location a top surface and a bottom surface of the second capping material is in physical contact with the first capping material.

6. The semiconductor device of claim 5, wherein a ratio of a first thickness of the first capping material at the first location to a second thickness of the first capping material over the uppermost nanosheet is in a range from 0.25 to 2.

7. The semiconductor device of claim 1, wherein the space between a bottom surface of an uppermost nanosheet and a top surface of a second nanosheet below the uppermost nanosheet is free of the gate fill material.

8. A semiconductor device comprising:
a gate structure over a semiconductor substrate;
source/drain regions over the semiconductor substrate and on opposing sides of the gate structure; and
a first channel layer and a second channel layer disposed between the source/drain regions and over the semiconductor substrate, wherein the first channel layer is between the second channel layer and the semiconductor substrate, wherein the gate structure comprises:
a gate dielectric material around the first channel layer and around the second channel layer;
a work function material around the gate dielectric material;
a first capping material around the work function material, wherein the first capping material comprises a semiconductor material, wherein a first portion of the first capping material is disposed around the first channel layer, wherein a second portion of the first capping material is disposed around the second channel layer;
a second capping material around the first capping material, wherein the second capping material physically separates the first portion of the first capping material from the second portion of the first capping material; and
a gate fill material.

9. The semiconductor device of claim 8, further comprising inner spacers between first end portions of the first channel layer and second end portions of the second channel layer, wherein the gate dielectric material, the work function material, the first capping material, and the second capping material completely fill a space between the inner spacers.

10. The semiconductor device of claim 8, wherein the first capping material comprises silicon.

11. The semiconductor device of claim 8, wherein each of the first channel layer and the second channel layer comprises a nanowire having a circular cross-section.

12. The semiconductor device of claim 8, wherein the work function material comprises titanium nitride or titanium aluminum, the first capping material comprises silicon, and the second capping material comprises titanium nitride or titanium aluminum.

13. The semiconductor device of claim 8, wherein the work function material and the second capping material are the same.

14. The semiconductor device of claim 8, wherein the second capping material is comprised of at least three materials that are different from each other.

15. The semiconductor device of claim 8, further comprising an interfacial dielectric material between the gate dielectric material and the first channel layer and between the gate dielectric material and the second channel layer, wherein the interfacial dielectric material, the gate dielectric material, the work function material, the first capping material, and the second capping material fill a space between the first channel layer and the second channel layer.

16. A method of forming a semiconductor device, the method comprising:
forming source/drain regions over a substrate;
forming a first nanosheet and a second nanosheet that are over the substrate, the first nanosheet disposed between the substrate and the second nanosheet;
depositing a gate dielectric material around the first nanosheet and the second nanosheet;
depositing a work function material around the gate dielectric material, wherein a first portion of the work function material extends along a first surface of the first nanosheet facing away from the substrate, and a second portion of the work function material extends along a second surface of the second nanosheet facing the substrate;
forming a first capping material around the work function material, wherein the first capping material comprises silicon;
forming a second capping material around the first capping material; wherein the first capping material and the second capping material fill a gap between the first portion and the second portion of the work function material; and
forming a gate fill material over the first nanosheet and the second nanosheet.

17. The method of claim 16, wherein the gap between the first portion and the second portion of the work function material is free of the gate fill material.

18. The method of claim 16, wherein the second capping material comprises titanium nitride or titanium aluminum.

19. The method of claim 16, further comprising:
forming an interfacial dielectric material around the first nanosheet and the second nanosheet by converting an exterior portion of the first nanosheet and the second nanosheet into an oxide through a thermal oxidization process.

20. The method of claim 16, wherein the second capping material has a same material composition as the work function material.

* * * * *